(12) United States Patent
Kubota

(10) Patent No.: US 7,719,011 B2
(45) Date of Patent: May 18, 2010

(54) EMISSIVE DEVICE AND ELECTRONIC APPARATUS

(75) Inventor: Taehiko Kubota, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 54 days.

(21) Appl. No.: 11/538,696

(22) Filed: Oct. 4, 2006

(65) Prior Publication Data

US 2007/0108440 A1    May 17, 2007

(30) Foreign Application Priority Data

Nov. 14, 2005   (JP) .............................. 2005-328491
Mar. 28, 2006   (JP) .............................. 2006-088287

(51) Int. Cl.
 *H01L 27/14* (2006.01)
 *H01L 29/04* (2006.01)
 *H01L 29/15* (2006.01)
 *H01L 31/036* (2006.01)

(52) U.S. Cl. .......... 257/72; 257/E29.278; 257/E27.111; 438/48; 438/128; 438/149

(58) Field of Classification Search .................... 257/59, 257/72, E29.278, E27.111; 345/100; 438/48, 438/128, 149, 151, 157, 283, 59, 88
See application file for complete search history.

(56) References Cited

U.S. PATENT DOCUMENTS

| | | | |
|---|---|---|---|
| 5,327,001 A | 7/1994 | Wakai et al. | |
| 6,887,100 B2 | 5/2005 | Matsueda et al. | |
| 6,900,470 B2 | 5/2005 | Kobayashi et al. | |
| 7,198,515 B2 | 4/2007 | Matsueda et al. | |
| 7,199,514 B2 | 4/2007 | Yoneda | |
| 7,291,970 B2 | 11/2007 | Kuwabara | |
| 7,580,014 B2 | 8/2009 | Tanaka et al. | |
| 2002/0158835 A1* | 10/2002 | Kobayashi et al. | .......... 345/100 |
| 2003/0197178 A1* | 10/2003 | Yamazaki et al. | ............. 257/59 |
| 2005/0077814 A1 | 4/2005 | Koo et al. | |
| 2006/0022583 A1 | 2/2006 | Koo et al. | |
| 2006/0028123 A1 | 2/2006 | Koo et al. | |
| 2006/0060850 A1* | 3/2006 | Kwak et al. | .................... 257/59 |

FOREIGN PATENT DOCUMENTS

| | | |
|---|---|---|
| CN | 1606389 A | 4/2005 |
| JP | A 2002-318556 | 10/2002 |
| JP | 2004-127933 A | 4/2004 |
| JP | 2004-134356 A | 4/2004 |
| JP | 2004-139970 A | 5/2004 |
| JP | 2005-019211 A | 1/2005 |

* cited by examiner

*Primary Examiner*—Cuong Q Nguyen
*Assistant Examiner*—Cathy N Lam
(74) *Attorney, Agent, or Firm*—Oliff & Berridge, PLC

(57) ABSTRACT

An emissive device includes a substrate; a switching element disposed on a surface of the substrate; an insulating layer covering the switching element; a contact hole disposed in the insulating layer; a first electrode disposed on a surface of the insulating layer and electrically connected to the switching element via the contact hole in the insulating layer; a second electrode disposed at a side opposite the substrate with respect to the first electrode; a luminescent layer disposed between the first electrode and the second electrode; and a light shield disposed at a side from which light from the luminescent layer emerges and having a portion covering the contact hole when viewed in a direction perpendicular to the substrate.

17 Claims, 12 Drawing Sheets

EMISSIVE DEVICE AND ELECTRONIC APPARATUS

CROSS-REFERENCE TO RELATED APPLICATIONS

The present application claims priority from Japanese Patent Applications Nos. JP 2005-328491, and JP 2006-088287, filed in the Japanese Patent Office on Nov. 14, 2005, and Mar. 28, 2006, respectively, the entire disclosures of which are hereby incorporated by reference in their entireties.

BACKGROUND

1. Technical Field

The present invention relates to structures of emissive devices including various emissive materials such as organic electroluminescent materials.

2. Related Art

Active matrix emissive devices including switching elements, such as transistors, for controlling light emission from luminescent layers have been proposed. For example, JP A-2002-318556 discloses such an emissive device including the switching element disposed on a surface of a substrate, an insulating layer covering the switching element, a first electrode and a second electrode that are disposed on the surface of the insulating layer, and the luminescent layer disposed between the electrodes. The first electrode is electrically connected to the electrode (a drain electrode or a source electrode) of the switching element via a contact hole disposed in the insulating layer.

However, in this structure, external light, such as sunlight and light from a luminaire, passes through the contact hole in the insulating layer, reaches the electrode of the switching element, is reflected from the surface, and emerges from a viewing side, in some cases. The light reflected from the surface is referred to as "undesirable reflection", hereinafter. The undesired reflection has characteristics, such as light intensity and spectral characteristics, different from those of light from the luminescent layer, thus causing the nonuniformity of the quantity of light, i.e., nonuniformity of luminance, in the plane of the emissive device.

Furthermore, for example, in a structure in which a luminescent layer is formed not only on an insulating layer but also inside a contact hole, light (hereinafter, referred lo as "undesirable light") is also emitted from the portion of the luminescent layer disposed along the inner surface of the contact hole. However, the portion of the luminescent layer disposed on the surface of the insulating layer has a thickness different from that of the portion of the luminescent layer disposed inside the contact hole; hence, light emitted from the former portion has the quantity of light and spectral characteristics different from those of the light emitted from the latter portion. Therefore, the undesirable light in the structure can also cause the nonuniformity (unevenness) of the quantity of light in the plane of the emissive device.

SUMMARY

As described above, in the structure in which the switching element is electrically connected to the first electrode via the contact hole in the insulating layer, the undesirable reflection from the electrode disposed at the bottom of the contact hole and the undesirable emitted light from the luminescent layer inside the contact hole disadvantageously cause the nonuniformity of light intensity, i.e., degrade the evenness of the light emission. An advantage of some aspects of the invention is to suppress the nonuniformity of the quantity of light due to the contact hole of the insulating layer.

According to an aspect of the invention, an emissive device includes a substrate; a switching element disposed on a surface of the substrate (for example, a driving transistor Tdr shown in FIG. 2); an insulating layer covering the switching element (for example, an second insulating layer 42 shown in FIG. 3); a contact hole (for example, a contact hole CH shown in FIGS. 2 and 3) disposed in the insulating layer; a first electrode disposed on a surface of the insulating layer and electrically connected to the switching element via the contact hole in the insulating layer; a second electrode disposed at a side opposite the substrate with respect to the first electrode; a luminescent layer disposed between the first electrode and the second electrode; and a light shield (for example, a auxiliary lead 70 or a light-shielding layer 81 in each embodiment) disposed at a side from which light from the luminescent layer emerges and having a portion covering the contact hole when viewed in a direction perpendicular to the substrate.

According to the structure, the light shield overlapping the contact hole when viewed in the direction perpendicular to the substrate is disposed at a viewing side with respect to the insulating layer, i.e., the light shield is disposed at the side from which light from the luminescent layer emerges. As a result, external light, such as sunlight and light from a luminaire, is blocked by the light shield and thus does not reach the contact hole or the switching element (in particular, the electrode of the switching element). Even if external light passes through the contact hole to reach the switching element, the undesirable reflection from the surface is blocked by the light shield. Furthermore, in a structure in which the luminescent layer is disposed inside the contact hole (for example, FIGS. 9 to 13), the undesirable light emitted from the portion of the luminescent layer disposed along the inner surface of the contact hole is blocked by the light shield. As described above, according to an aspect of the invention, since the undesirable reflection and the undesirable light are blocked by the light shield, it is possible to suppress the nonuniformity of the quantity of light due to the contact hole.

The phrase "the side from which light from the luminescent layer emerges with respect to the insulating layer" means a side designed in a mariner such that light emitted from the luminescent layer emerges from the side. For example, in a bottom emission device including the first electrode that transmits light, a substrate side with respect to the insulating layer corresponds to "the side from which light from the luminescent layer emerges". In a top emission device including the second electrode that transmits light, a side opposite to the substrate with respect to the insulating layer corresponds to "the side from which light from the luminescent layer emerges". From the standpoint of the application of the emissive device, in the case where the emissive device is used as a display, a viewing side with respect to the insulating layer corresponds to the "the side from which light from the luminescent layer emerges", i.e., the viewing side corresponds to the side at which an observer that visually identifies an image displayed with the emissive display is located. In the case where the emissive device is used as an exposure device (exposure head) for exposing a photoreceptor, such as a photosensitive drum, a photoreceptor side with respect to the insulating layer corresponds to "the side from which light from the luminescent layer emerges".

When the light shield has a higher light reflectivity than the electrode of the switching element, the nonuniformity of light emission due to the contact hole is surely eliminated. However, external light reflected from the light shield may have an effect on the uniformity of the light emission. According to a preferred aspect of the invention, the switching element further includes an electrode (for example, a drain electrode 34 shown in FIGS. 2 and 3) extending through the contact hole and having a portion not covered with the insulating layer, the portion being in contact with the first electrode, wherein the light shield is composed of a material having a lower light reflectivity than the electrode of the switching element. In this structure, since the light shield is composed of a material having a lower light reflectivity than the electrode of the switching element, the influence of both reflection due to the contact hole and reflection due to the light shield is eliminated to improve the uniformity of the light emission.

In the case of the second electrode with high resistance, a voltage drop across the second electrode may degrade the uniformity of light emission. In a structure (top emission type) in which the second electrode is composed of a high-resistance material, such as indium tin oxide (ITO) or indium zinc oxide (IZO), and a structure in which the second electrode extends widely and continuously, the voltage drop across the second electrode is particularly significant, thus further degrading the nonuniformity of light emission. According to a preferred aspect of the invention, an auxiliary lead composed of a conductive material having a lower resistivity than the second electrode and electrically connected to the second electrode is used as the light shield. In this structure, the auxiliary lead electrically connected to the second electrode suppresses the voltage drop, thereby improving the nonuniformity of light emission due to the voltage drop. Embodiments of the aspect will be described as a first embodiment (FIGS. 2 and 3), a second embodiment (FIGS. 5 and 6), a fourth embodiment (FIG. 9), a fifth embodiment (FIG. 10), and a eighth embodiment (FIGS. 14 and 15).

The structure in which the auxiliary lead is also used as the light shield is exemplified above. Alternatively, in an aspect of the invention, a structure in which an auxiliary lead separate from the light shield is disposed may also be used. In the latter structure, the auxiliary lead composed of a material having satisfactory optical transparency does not cause a particular problem. However, to meet the requirement that the auxiliary lead has a lower resistivity than the second electrode, in many cases, a conductive material is necessarily selected as the material for the auxiliary lead. In the structure in which the auxiliary lead separate from the light shield is disposed, an aperture ratio, i.e., the ratio of an area from which light is actually emitted to an area at which pixels are disposed, is disadvantageously reduced by an area at which the auxiliary lead is disposed, as compared with a structure in which the auxiliary lead is not disposed. In contrast, as exemplified above, according to the aspect in which the auxiliary lead is also used as the light shield, the aperture ratio is advantageously increased compared with the structure in which the auxiliary lead separate from the light shield is disposed. The increased aperture ratio results in a reduction in electrical energy to be fed to the luminescent layer for emitting light with a predetermined quantity of light from the emissive device. Higher electrical energy promotes the degradation of characteristics of the luminescent layer (in particular, composed of an organic electroluminescent material). Thus, in the aspect in which the electrical energy fed to the luminescent layer can be reduced, the life of the luminescent layer (time required for values of characteristics, such as the quantity of light and luminous efficiency, to decrease to a predetermined value) can be advantageously prolonged, as compared with the structure in which the aperture ratio is limited to the auxiliary lead.

In the aspect in which the auxiliary lead is used as the light shield, more preferably, the auxiliary lead completely covers a region surrounded by the inner periphery of the contact hole when viewed in the direction perpendicular to the substrate. According to the aspect, it is possible to further increase the rate in which the light shield blocks the undesirable reflection and the undesirable light due to the contact hole. Embodiments of the aspect will be described below as the first embodiment (FIGS. 2 and 3) and the fourth embodiment (FIG. 9). In the formation of the light shield (auxiliary lead) by a film-forming technique, such as evaporation using a mask, when the light shield is formed so as to completely cover the opening of the contact hole, the position of the light shield is deviated from a designed position due to nonuniformity in a production process, i.e., due to the deviation of the mask, in some cases. Such a structure in which part of the opening is not covered with the light shield because of the error also meets the requirement of the aspect that "the light shield completely covers the region surrounded by the inner periphery of the contact hole", as long as the light shield is designed to completely cover the opening.

Alternatively, the auxiliary lead may be designed to partially overlap the region surrounded by the inner periphery of the contact hole (for example, a region A1 shown in FIGS. 6 and 10) when viewed in the direction perpendicular to the substrate. In this structure, more preferably, a light-shielding layer having a portion overlapping a region not overlapping the auxiliary lead in the region surrounded by the inner periphery of the contact hole (for example, a region A2 shown in FIGS. 6 and 10) is further disposed. In this structure, the undesirable reflection and the undesirable light that are not blocked by the auxiliary lead are blocked by the light shielding layer. Thus, in the same way as in the aspect in which the auxiliary lead completely covers the opening of the contact hole, it is possible to further increase the rate in which the light shield blocks the undesirable reflection and the undesirable light due to the contact hole. Embodiments of the aspect will be described below as, for example, the second embodiment (FIGS. 5 and 6) and the fifth embodiment (FIG. 10).

The structure in which the auxiliary lead is also used as the light shield is exemplified above. Alternatively, in an aspect of the invention, a structure in which an auxiliary lead separate from the light shield is disposed may also be used. In the aspect, if the auxiliary lead has light reflectivity, reflection (external light) from the surface of the auxiliary lead may degrade the uniformity of light emission. Accordingly, in more preferred aspect, the light shield overlaps the auxiliary lead when viewed in the direction perpendicular to the substrate. According to the aspect, the light shield also blocks reflection from the surface of the auxiliary lead as well as the undesirable reflection and the undesirable light due to the contact hole; hence, it is possible to maintain the uniformity of light emission. In other words, even when the auxiliary lead is composed of a conductive material having light reflectivity, the uniformity of light emission is not impaired. This can advantageously expand the range of material options for the auxiliary lead. Embodiments of the aspect will be described below as, for example, the third embodiment (FIGS. 7 and 8), a sixth embodiment (FIG. 11), and a seventh embodiment (FIGS. 12 and 13).

In the above-described aspects, any shape of the auxiliary lead may be used. In an aspect in which a plurality of element groups (for example, each group including a plurality of luminescent elements being arranged in each row) each including a plurality of luminescent elements are arranged in a second direction crossing a first direction, the luminescent elements each having the first electrode, the second electrode, and the luminescent layer and being arranged in the first direction (for example, the X-direction in FIG. 16), for example, each auxiliary lead is disposed in the space (for example, a space S1 shown in FIG. 16) between a first element group (for example, row i shown in FIG. 16) and a second element group (for example, row (i+1)) adjacent to the first element group, the auxiliary lead extending in the first direction. The auxiliary lead is not disposed in the space (for example, a space S2 shown in FIG. 16) between the second element group and a third element group (for example, row (i+2) shown in FIG. 16) which is adjacent to the second element group and which is disposed at a position opposite to the first element group with respect to the second element group. In this aspect, since the auxiliary lead is not disposed on the space between the second element group and the third element group, it is possible to reduce the areas of a region in which the auxiliary leads are disposed and of a region (marginal region) ensured between the auxiliary lead and the luminescent element, as compared with a structure in which each of the auxiliary leads is disposed in the space between any adjacent element groups. Thus, this structure easily achieves a balance between the improvement of the aperture ratio and a reduction in the resistance of the auxiliary lead. For example, the aperture ratio can be increased without a reduction in the line width of the auxiliary lead. Alternatively, the line width of the auxiliary lead can be increased (a reduction in resistance) without a reduction in aperture ratio (area of the luminescent element).

In the above-described structure in which a single auxiliary lead is disposed with respect to a unit of two or more element groups, in order to form the auxiliary lead, evaporation is suitably employed with a mask. That is, in a process for producing the emissive device, a step of forming the auxiliary lead includes preparing a mask having a predetermined shape; and depositing a material having a lower resistivity than the second electrode by evaporation with the mask to form the auxiliary lead. The mask prepared in the former step has an opening at a region (for example, a region RA shown in FIG. 18) facing the space between the first element group and the second element group adjacent to the first element group and has an unperforated region facing the space between the second element group and the third element group which is adjacent to the second element group and which is disposed at a position opposite to the first element group with respect to the second element group. The mask for use in the step has the unperforated region facing the space between the second element group and the third element group and thus has higher mechanical strength, as compared with that of a mask having openings perforated at regions each facing a space between any adjacent element groups. Therefore, the error of the auxiliary lead and the failure of the mask due to the deformation of the mask are suppressed.

According to a preferred aspect of the invention, a space in the contact hole is filled with an insulating portion composed of an insulating material, and the luminescent layer is not disposed in the contact hole. According to the structure, since the luminescent layer is not present in the contact hole, the uniformity of light emission is not impaired by the undesirable light emitted from the portion. Embodiments of the aspect will be described below as, for example, the first embodiment (FIGS. 2 and 3), the second embodiment (FIGS. 5 and 6), and the third embodiment (FIGS. 7 and 8). The luminescent layer may be disposed so as to be separated with the insulating portion. Alternatively, the luminescent layer may be continuously disposed so as to cover the insulating portion (for example, see FIG. 20).

In another aspect of the invention, the light shield extends to a predetermined direction, and the contact hole has a length along the predetermined direction when viewed in the direction perpendicular to the substrate. According to the aspect, the area of the contact hole is sufficiently ensured; hence, it is possible to reduce the resistance of a contact region between the first electrode and the switching element. Alternatively, it is possible to increase the reliability of the continuity between the first electrode and the switching element.

An emissive device according to an aspect of the invention can be used as any one of a top-emission-type emissive device and a bottom-emission-type emissive device. In the top-emission-type emissive device, the second electrode transmits light emitted from the luminescent layer. In the bottom-emission-type emissive device, the first electrode transmits light emitted from the luminescent layer. In a preferred aspect of the bottom-emission-type emissive device, the switching element includes an electrode extending through the contact hole, the electrode having a portion not covered with the insulating layer, and the portion being in contact with the first electrode. The light shield is composed of a material having a lower light reflectivity than the electrode of the switching element and is disposed between the electrode of the switching element and the substrate, the light shield being opposite to the electrode. Also according to the aspect, the light shield blocks the reflection from the electrode of the switching element, thus maintaining the uniformity of light emission. The embodiment of the bottom-emission-type emissive device will be described below as the eighth embodiment (FIGS. 14 and 15).

In the bottom-emission-type emissive device as exemplified above, a structure in which the auxiliary lead is also used as the light shield is also used. In the structure, the auxiliary lead is electrically connected to the second electrode via the contact hole (for example, a contact hole CH5 shown in FIG. 14) in the insulating layer. Furthermore, the light shield is preferably composed of the same material as that of a subelement (for example, a gate electrode 242 shown in FIG. 14) constituting the switching element. According to the aspect, the electrodes of the switching element and the light shield can be simultaneously formed by patterning a single conductive film. Thus, it is possible to simplify a production process and reduce production costs, as compared with the case where the light shield is formed by a step different from a step of forming the switching element.

An emissive device according to an aspect of the invention is used in any one of various electronic apparatuses. An exemplary electronic apparatus is an apparatus including the emissive device functioning as a display. Examples of the apparatus include personal computers and cellular phones. However, the application of the emissive device according to an aspect of the invention is not limited to displaying an image. Examples of the application include an exposure device (exposure head) for forming a latent image on an image carrier, such as a photosensitive drum, by irradiation of light; a device (backlight) for illuminating a liquid-crystal apparatus, the device being disposed at the back side of the liquid-crystal apparatus; and an apparatus installed in an image scanner or the like and for illuminating a source document. In this way, the emissive device according to an aspect of the invention can be applied to any one of various applications.

BRIEF DESCRIPTION OF THE DRAWINGS

The invention will be described with reference to the accompanying drawings, wherein like numbers reference like elements.

FIG. 6 is a cross-sectional view taken along line VI-VI in FIG. 5.

FIG. 7 is a plan view of the structure of a pixel according to a third embodiment of the invention.

DESCRIPTION OF EXEMPLARY EMBODIMENTS

A: First Embodiment

Figure 1:
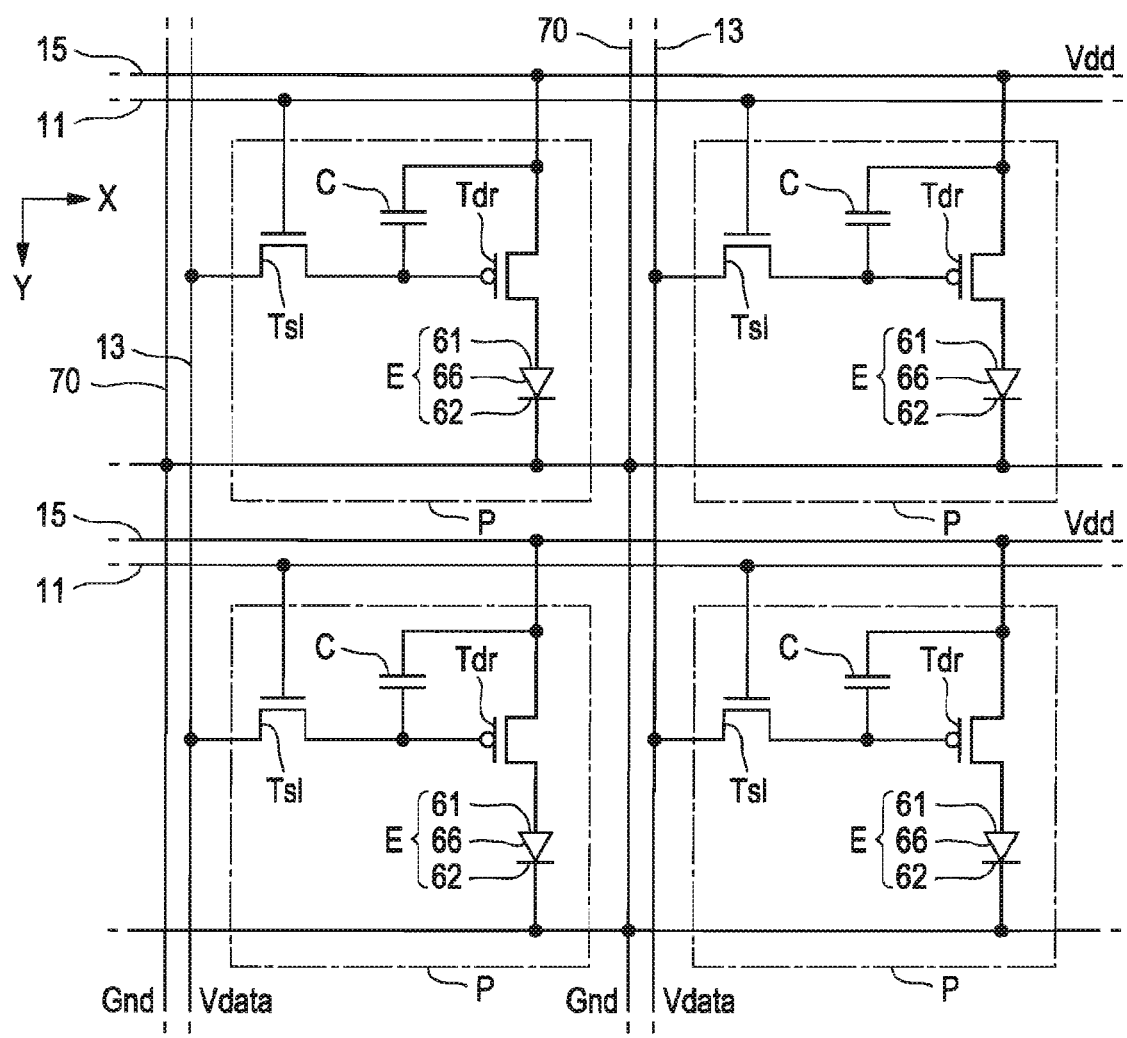
FIG. 1 is a circuit diagram showing an electrical structure of an emissive device according to a first embodiment of the invention.

FIG. 1 is a diagram showing the electrical structure of an emissive device according to a first embodiment of the invention. The emissive device D is incorporated in any one of various electronic apparatuses and serves as a display for displaying an image. As shown in FIG. 1, the emissive device D includes a plurality of selection lines 11 each extending in the X-direction and a plurality of signal lines 13 each extending in the Y-direction perpendicular to the X-direction. Pixels P are disposed at intersections between the selection lines 11 and the signal lines 13. Therefore, the pixels P are arranged in the x and Y-directions, i.e., the pixels P are arrayed in a matrix in a predetermined region (hereinafter, referred to as a "luminescent region").

Each pixel P includes a luminescent element E that luminesces when a current is fed thereto, a driving transistor Tdr for controlling the current fed to the luminescent element E, and a section transistor Tsl. The luminescent element E includes a luminescent layer 66 composed of an organic electroluminescent material, a first electrode 61, and a second electrode 62, the luminescent layer 66 being disposed between the first electrode 61 and the second electrode 62. The luminescent layer 66 emits light with luminance (quantity of light) in response to a current that flows from the first electrode 61 to the second electrode 62.

The driving transistor Tdr is a switching element for controlling a current feed to the luminescent element E. A source electrode is connected to a power line 15. A higher power-supply potential Vdd is applied to the Dower line 15. A capacitor C for maintaining the potential of the gate electrode is disposed between a gate electrode and the source electrode of the driving transistor Tdr. The drain electrode of the driving transistor Tdr is connected to the first electrode 61 of the luminescent element E. A lower power-supply potential Gnd is applied to the second electrode 62 of the luminescent element E via an auxiliary lead 70. The effect and the specific shape of the auxiliary lead 70 will be described below.

The selection transistors Tsl are each disposed between the gate electrode of the driving transistor Tdr and the signal line 13 and serves as a switching element for controlling the electrical connection between the gate electrode of the driving transistor Tdr and the signal line 13. The gate electrode of each selection transistor Tsl is connected to the selection line 11. In this embodiment, a structure including a p-channel driving transistor Tdr and an n-channel selection transistor Tsl is exemplified. However, the conductivity type of each transistor may be desirably changed.

A selection signal fed to the selection lines 11 shifts to an active level to bring the selection transistor Tsl into an ON state. As a result, a data potential Vdata in response to a specified gray scale of the pixel P is applied from the signal line 13 to the gate electrode of the driving transistor Tdr via the selection transistor Tsl. At this time, charge in response to the data potential Vdata is accumulated in the capacitor C. Thus, even when the selection lines 11 shifts to a nonactive level to bring the selection transistor Tsl into an OFF state, the potential applied to the gate electrode of the driving transistor Tdr is maintained at the data potential Vdata. A current in response to the potential applied to the gate electrode of the driving transistor Tdr, i.e., the current in response to the data potential Vdata, is fed to the luminescent element E. As a result, the luminescent element E illuminates at a luminance level (the quantity of light) in response to the data potential Vdata.

Figure 2:
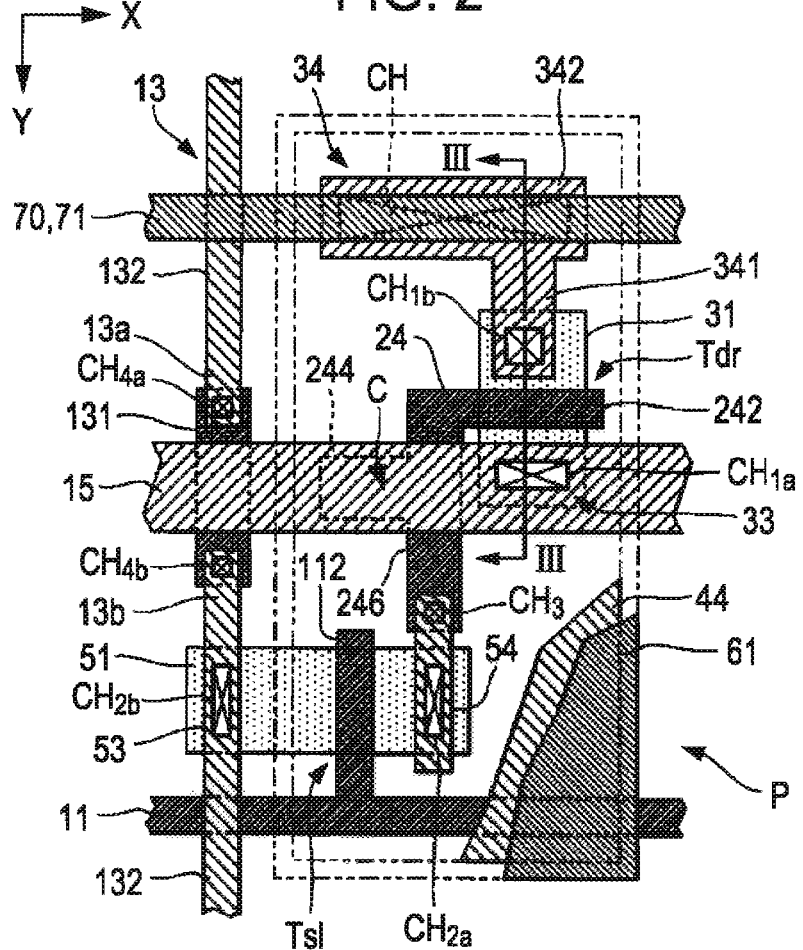
FIG. 2 is a plan view showing the structure of a pixel.
Figure 3:
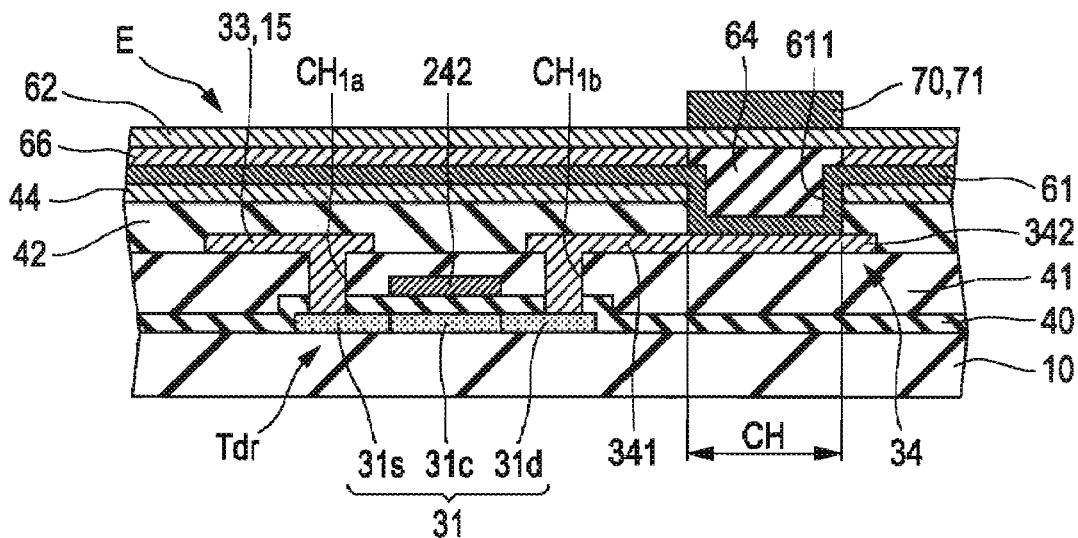
FIG. 3 is a cross-sectional view taken along line III-III in FIG. 2.

FIG. 2 is a plan view showing a specific structure of a single pixel P. FIG. 3 is a cross-sectional view taken along line III-III in FIG. 2. Although FIG. 2 is a plan view, in order to easily understand elements, the same elements as those shown in FIG. 3 are hatched using the same hatch patterns as those shown in FIG. 3. The same is true in plan views (FIGS. 5, 7, 12, and 14) according to the following embodiments. In FIG. 2, for the sake of convenience, the luminescent layer 66 and the second electrode 62 shown in FIG. 1 are not shown.

As shown in FIG. 3, the elements, such as the driving transistor Tdr and the luminescent element E, shown in FIG. 1 are disposed on a surface of a substrate 10. The substrate 10 is a flat member composed of an insulating material, such as glass or plastic, and having a substantially rectangular shape.

The elements of the pixel P may be disposed on an underlying insulating film, such as a film composed of silicon oxide or silicon nitride, covering the substrate 10. Hereinafter, a side in which the driving transistor Tdr and the luminescent element E are disposed with respect to the substrate 10, i.e., the upper side in FIG. 3, is referred to as a "viewing side". That is, the term "viewing side" means the side at which an observer that visually identifies an image displayed with the emissive display D is located.

As shown in FIGS. 2 and 3, the driving transistor Tdr includes a semiconductor layer 31 disposed on a surface of the substrate 10, a gate insulating layer 40 disposed on the entire surface of the substrate 10 and covering the semiconductor layer 31, a gate electrode 242 disposed on the semiconductor layer 31 provided with the gate insulating layer 40 therebetween, a source electrode 33, and a drain electrode 34. The semiconductor layer 31 is composed of a semiconductor material such as silicon and is a film having a substantially rectangular shape.

As shown in FIG. 2, an intermediate conductor 24 is disposed on the gate insulating layer 40. The intermediate conductor 24 has a portion extending in the X-direction, the portion being in contact with the semiconductor layer 31. The contact area is the gate electrode 242. As shown in FIG. 3, the semiconductor layer 31 includes a channel region 31c opposite the gate electrode 242 provided with the gate insulating layer 40 therebetween, a source region 31s, and a drain region 31d, the channel region 31c being disposed between the source region 31s and the drain region 31d.

As shown in FIG. 3, the entire surface of the substrate 10 having the semiconductor layer 31 and the gate electrode 242 (intermediate conductor 243 is covered with a first insulating layer 41. The source electrode 33 and the drain electrode 34 are disposed on the surface of the first insulating layer 41. As shown in FIG. 2, the source electrode 33 is a portion of the power line 15 extending the X-direction. The source electrode 33 is electrically connected to the source region 31s of the semiconductor layer 31 via a contact hole CH1a passing through the first insulating layer 41 and the gate insulating layer 40.

The drain electrode 34 has a unitary structure of a first portion 341 and a second portion 342. The first portion 341 is electrically connected to the drain region 31d of the semiconductor layer 31 via a contact hole CH1b passing through the first insulating layer 41 and the gate insulating layer 40. The second portion 342 is a portion extending in the X-direction, as shown in FIG. 2.

As shown in FIG. 2, the intermediate conductor 24 includes an electrode portion 244 covered with the power line 15 and an interconnection portion 246 extending from the gate electrode 242 toward the Y-direction and crossing the power line 15. The electrode portion 244 is opposite the power line 15 provided with the first insulating layer 41 therebetween to form the capacitor C shown in FIG. 1.

As shown in FIG. 2, the selection transistor Tsl includes a semiconductor layer 51 disposed on the surface of the substrate 10, a gate electrode 112 opposite the channel region of the semiconductor layer 51 provided with the gate insulating layer 40 therebetween, a drain electrode 53 disposed on the surface of the first insulating layer 41 covering the gate electrode 112, and a source electrode 54. The gate electrode 112 is a portion branched off in the Y-direction from the selection lines 11 extending in the X-direction, the portion covering the semiconductor layer 51. The selection lines 11 and the intermediate conductor 24 are simultaneously formed by patterning a common conductive film. Similarly, the drain electrode 53, the source electrode 54, the source electrode 33 (power line 15) and the drain electrode 34 of the driving transistor Tdr are simultaneously formed by patterning a single conductive film.

The drain electrode 53 is electrically connected to the drain region of the semiconductor layer 51 via a contact hole CH2b passing through the first insulating layer 41 and the gate insulating layer 40. Similarly, the source electrode 54 is electrically connected to the source region of the semiconductor layer 51 via a contact hole CH2a. The source electrode 54 is electrically connected to the interconnection portion 246 of the intermediate conductor 24 via a contact hole CH3 passing through the first insulating layer 41. As a result, the source electrode 54 of the selection transistor Tsl is electrically connected to the gate electrode 242 of the driving transistor Tdr.

As shown in FIG. 2, the signal lines 13 shown in FIG. 1 includes an intersection portion 131 disposed under the power line 15 and extending in the Y-direction to cross the power line 15; and an interconnection portion 132 disposed between the power lines 15 and extending in the Y-direction. The intersection portion 131 is formed of the conductive film common to the selection lines 11 and the intermediate conductor 24. The interconnection portion 132 is formed of the conductive film common to the source electrode 33 and the drain electrode 34 of the driving transistor Tdr. The end 13a of the interconnection portion 132 is electrically connected to the intersection portion 131 via a contact hole CH4a in the first insulating layer 41. Similarly, the end 13b of the interconnection portion 132 is electrically connected to the intersection portion 131 via a contact hole CH4b in the first insulating layer 41. As described above, the signal lines 13 have the electrical connection of the intersection portions 131 and the interconnection portions 132. The drain electrode 53 of the selection transistor Tsl is a portion of the interconnection portion 132, the portion overlapping the semiconductor layer 51.

As shown in FIG. 3, the entire surface of the first insulating layer 41 having the power line 15 and the drain electrode 34 is covered with a second insulating layer 42. The first insulating layer 41 and the second insulating layer 42 are composed of an insulating material, such as silicon oxide or silicon nitride. As shown in FIGS. 2 and 3, a contact hole CH is formed at a portion where the second insulating layer 42 overlaps the second portion 342 of the drain electrode 34 when viewed in a direction perpendicular to the substrate 10, the contact hole CH passing through the second insulating layer 42 in the thickness direction. Thus, the second portion 342 is not covered with the second insulating layer 42 but exposed at the contact hole CH. As shown in FIG. 2, when viewed in the direction perpendicular to the substrate 10, the contact hole CH has a substantially rectangular shape and has a length along the X-direction.

Reflective layers 44 having substantially rectangular shapes are each disposed on the surface of the second insulating layer 42 for every pixel P, the reflective layers 44 being separated from each other. The reflective layer 44 is composed of a material having light reflectivity, for example, an aluminum alloy, a silver alloy, or an alloy mainly containing aluminum or silver. The reflective layer 44 reflects light emitted from the luminescent layer 66 toward the substrate 10 to the viewing side (the upper side of FIG. 3). Furthermore, first electrodes 61 (see FIG. 1) functioning as anodes of the luminescent elements E are each disposed on the surface of the second insulating layer 42 for every pixel P, the first electrodes 61 being separated from each other. Each first electrode 61 is a substantially rectangular electrode covering the reflective layer 44. The first electrodes 61 are each composed of an optically transparent conductive material, such as indium tin oxide (ITO) or indium zinc oxide (IZO). As shown in FIGS. 2 and 3, the first electrode 61 is disposed in the contact hole CH in the second insulating layer 42 and is in contact with the drain electrode 34 (second portion 342) of the driving transistor Tdr, thereby electrically connecting the first electrode 61 and the driving transistor Tdr.

The first electrode 61 is formed by any one of various film-forming techniques, such as sputtering and vacuum evaporation, so as to have a sufficiently thin thickness with respect to the external dimension of the contact hole CH. Thus, as shown in FIG. 3, the first electrode 61 has a recess 611 (depression) in response to the film thickness of the second insulating layer 42 and the external dimension of the contact hole CH. That is, the portion of the first electrode 61 being in contact with the drain electrode 34 corresponds to the bottom of the recess 611. The portion of the first electrode 61 covering the inner periphery of the first electrode 61 corresponds to the side faces of the recess 611.

As shown in FIG. 3, an insulating portion 64 is disposed inside the recess 61 i.e., the insulating portion 64 is disposed in a space inside the contact hole CH. The insulating portion 64 is composed of an insulating material, such as a resin material, e.g., a polyimide. As shown in FIG. 3, the recess 611 in the contact hole CH is filled with the insulating portion 64. The insulating portion 64 is in contact with the bottom and the inner periphery of the recess 611. Furthermore, the upper face of the insulating portion 64 protrudes from the surface of the first electrode 61. The insulating portion 64 also has the effect of planarizing bumps of the recess 611. From the standpoint of effective expression of the effect, a resin material is particularly suitable as the material for the insulating portion 64. When the resin material is used, first, the surface of the insulating portion 64 can be easily planarized by application of a liquid resin material at low cost; second, the insulating portion 64 having a sufficient thickness for planarization of the recess 611 can be formed without the occurrence of a crack; and third, the surface of the insulating portion 64 can be planarized by melting the resin material resulting from heat treatment for curing the resin material.

Luminescent layers 66 shown in FIG. 1 are disposed the respective pixels P and cover the surfaces of the first electrodes 61. As shown in FIG. 3, the luminescent layer 66 is not present in the region in which the insulating portion 64 is disposed, i.e., the luminescent layer 66 is separated by the insulating portion 64. Thus, the luminescent layer 66 is not disposed in the space (recess 611) inside the contact hole CH. The luminescent layer 66 may be composed of any one of polymeric materials and low molecular weight materials. Furthermore, to promote the light emission from the luminescent layer 66 or to increase the luminous efficiency of the luminescent layer 66, a structure in which various functional layers, such as a hole injection layer, a hole transport layer, an electron injection layer, an electron transport layer, a hole blocking layer, and an electron blocking layer, are laminated on the luminescent layer 66 may be used.

As shown in FIG. 3, the second electrode 62 shown in FIG. 1 serves as an electrode covering the insulating portion 64 and the luminescent layer 66. The second electrode 62 covers the entire surface of the substrate 10. The second electrode 62 is continuously disposed over the pixels P. The second electrode 62 according to this embodiment is composed of an optically transparent conductive material, such as ITO or IZO. Thus, light from the luminescent layer 66 toward a side opposite the substrate 10 and light emitted from the luminescent layer 66 toward the substrate 10 and then reflected from the surface of the reflective layer 44 emerge from the viewing side through the second electrode 62. That is, the emissive device D according to this embodiment is of top emission type in which light emitted from the luminescent element E emerges from a side opposite the substrate 10. Furthermore, since the luminescent layer 66 is not present in the region (contact hole CH) in which the insulating portion 64 is disposed (and since the first electrode 61 is insulated from the second electrode 62 by the insulating portion 64), this region does not contribute to light emission (dead space).

Most of optically transparent conductive materials have high resistivity; hence, the second electrode 62 composed of such a material has high resistance, thereby leading to significant voltage drop in the plane thereof. Therefore, potentials different in response to the position in the plane of the second electrode 62 are applied to the luminescent elements E, thereby resulting in the nonuniformity of the quantity of light (nonuniformity of luminance and gray scale) in a luminescent region, in some cases.

To eliminate the nonuniformity of the quantity of light, in this embodiment, the auxiliary lead 70 is disposed to support the conductivity of the second electrode 62. The auxiliary lead 70 is composed of a conductive material having a lower resistivity than the second electrode 62. The auxiliary lead 70 according to this embodiment is in contact with the surface of the second electrode 62 and is electrically connected to the second electrode 62. According to this structure, most of current flows through the low-resistance auxiliary lead 70, thus suppressing the voltage drop in the second electrode 62. Therefore, a uniform potential is applied to the luminescent elements E, thus effectively suppressing the nonuniformity of the quantity of light due to the voltage drop. The auxiliary lead 70 according to this embodiment is composed of an opaque conductive material. More preferably, the auxiliary lead 70 is composed of a material having lower light reflectivity than the drain electrode 34.

Figure 4:
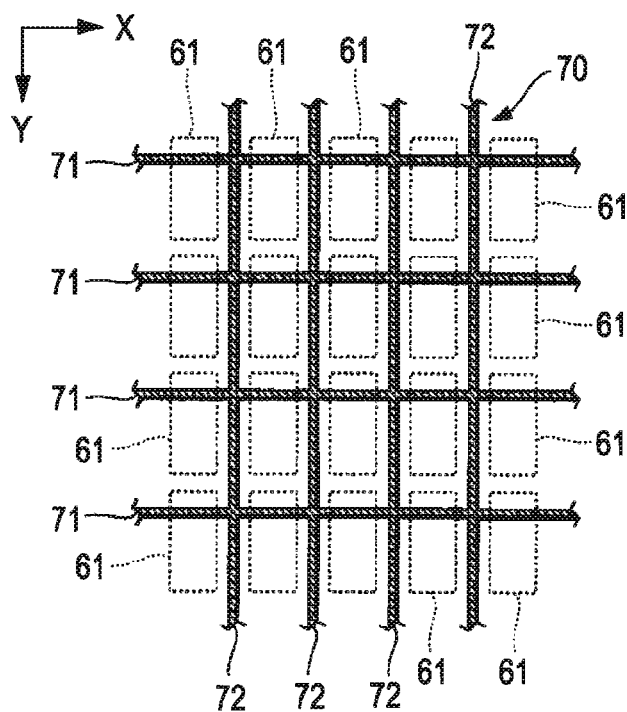
FIG. 4 is a plan view of an example of the structure of an auxiliary lead.

FIG. 4 is a plan view of an example of the structure of the auxiliary lead 70. FIG. 4 also shows outlines of the first electrodes 61 using broken lines. As shown in FIG. 4, the auxiliary lead 70 includes a plurality of first portions 71 extending in the X-direction in response to the rows of the pixels P; and a plurality of second portions 72 extending in the Y-direction in response to the columns of the pixels P, the first portions 71 crossing the second portions 72 to form a grid. However, the structure of the auxiliary lead 70 is not limited to the example shown in FIG. 4. For example, a structure in which the auxiliary lead 70 only has the plurality of the first portions 71 extending in the X-direction may be used.

As shown in FIG. 2, the first portions 71 of the auxiliary lead 70 overlap the contact holes CH of the second insulating layer 42 when viewed in the direction perpendicular to the substrate 10. In more detail, the first portions 71 according to this embodiment each have a width substantially equal to or greater than the width (dimension in the Y-direction) of the contact hole CH extending in the X-direction. Thus, as shown in FIGS. 2 and 3, each of the first portions 71 completely covers a region (hereinafter, referred to as an "opening") surrounded by the inner periphery of the contact hole CH when viewed in the direction perpendicular to the substrate 10.

Most of conductive materials that can be used as the materials for the drain electrode 34 of the driving transistor Tdr have light reflectivity. Thus, in a known structure not having the auxiliary lead 70, external light, such as sunlight or light from a luminaire, is incident to the viewing side, reaches the surface of the drain electrode 34, and is then reflected from the surface to emerge from the viewing side, in some cases. The reflected light is referred to as "undesirable light". The undesired reflection has characteristics different from those of light from the luminescent layer 66, thus disadvantageously causing the nonuniformity of the quantity of light in the plane of the luminescent region. In contrast, in this embodiment, the opaque auxiliary lead 70 completely covers the opening of the contact hole CH. Therefore, external light traveling from the viewing side to the drain electrode 34 is blocked at the surface of the auxiliary lead 70, the surface being adjacent to the viewing side. Even if external light reaches the drain electrode 34, the undesirable reflection from the surface is blocked at the surface of the auxiliary lead 70, the surface being adjacent to the substrate 10. As described above, according to this embodiment, the emergence of the undesirable reflection is prevented, thus uniformizing the quantity of light (luminance or gray scale) in the plane of the luminescent region.

In this embodiment, the structure in which the auxiliary lead 70 covers the contact hole CH is exemplified. As a structure for expressing the effect, for example, a structure in which an opaque component (hereinafter, referred to as a "light shield") separate from the auxiliary lead 70 covers the contact hole CH is conceivable. In this structure, the auxiliary lead 70 does not overlap the contact hole CH (for example, see FIGS. 8 and 11). However, in this structure, regions in which the contact hole CH and the auxiliary lead 70 are disposed do not contribute to light emission (dead space); hence, the aperture ratio of the emissive device D, i.e., the ratio of an area from which light is actually emitted to an area at which pixels P are disposed, is disadvantageously limited. In contrast, in this embodiment, since the auxiliary lead 70 is also used as the light shield for the contact hole CH, it is possible to increase the aperture ratio, as compared with the structures described above. In this embodiment, the increased aperture ratio results in a reduction in electrical energy to be fed to the luminescent layer 66 for emitting light with a predetermined quantity of light from the emissive device D. Higher electrical energy promotes the degradation of characteristics of the luminescent layer 66. Therefore, in this embodiment, the increase in aperture ratio prolongs the life of the luminescent layer.

Furthermore, to surely connect the driving transistor Tdr with the first electrode 61, preferably, the area of the contact hole CH, i.e., the contact area between the first electrode 61 and the drain electrode 34, is sufficiently ensured. However, in the structure in which the auxiliary lead 70 does not overlap the contact hole CH, an increase in the area of the contact hole CH disadvantageously reduces the aperture ratio by the increment. In contrast, in this embodiment, since the auxiliary lead 70 covers the contact hole CH, an increase in the area of the contact hole CH does not lead to a reduction in aperture ratio within the range of the region covered with the auxiliary lead 70. Thus, in this embodiment, as shown in FIG. 2, the contact hole CH that is long in the X-direction can sufficiently ensure the area of the contact hole CH, thereby reducing the resistance of the contact portion between the driving transistor Tdr and the first electrode 61.

B: Second Embodiment

A second embodiment of the invention will be described below. In emissive devices D having structures described below, the same or equivalent elements in the first embodiment are designated using the same reference numerals, and redundant description is not repeated.

Figure 5:
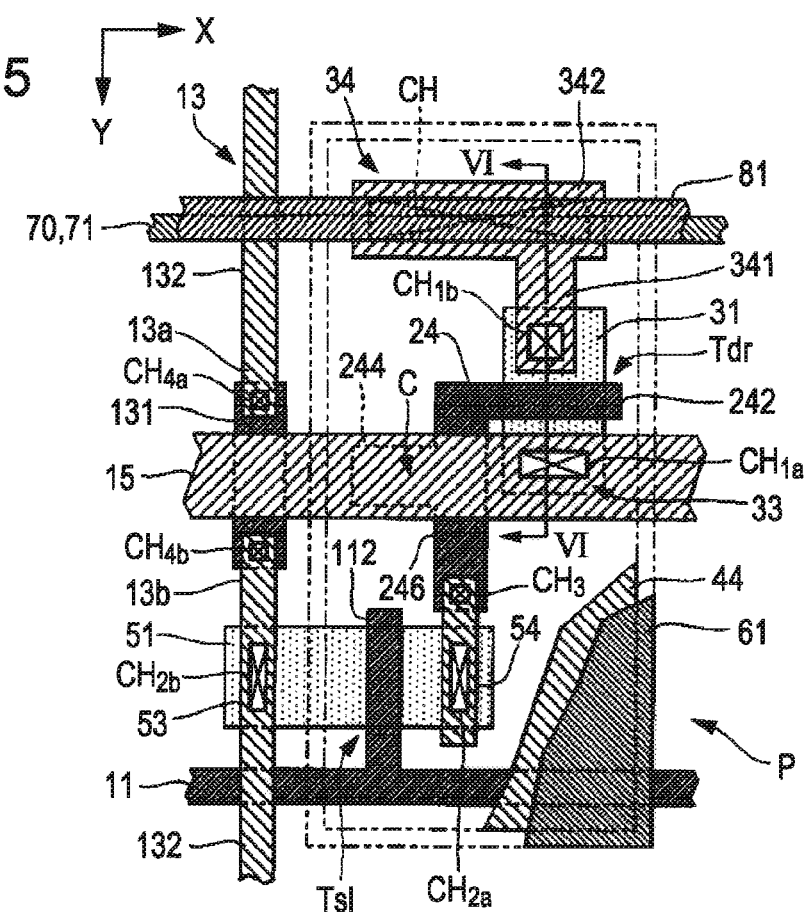
FIG. 5 is a plan view showing the structure of a pixel according to a second embodiment of the invention.

FIG. 5 is a plan view showing the structure of a pixel P according to this embodiment. FIG. 6 is a cross-sectional view taken along line VI-VI in FIG. 5. In the first embodiment, the structure in which the auxiliary lead 70 completely covers the opening of the contact hole CH is exemplified. In contrast, in this embodiment, as shown in FIGS. 5 and 6, the auxiliary lead 70 (first portions 71) overlaps only a region A1 in the opening of the contact hole CH. A region A2 in the opening shown in FIG. 6 is a region not overlapping the auxiliary lead 70.

As shown in FIG. 6, the emissive device D includes a substrate 80. The substrate 80 is an optically transparent flat member to prevent the luminescent element E from coming into contact with air and water. The substrate 80 faces the surface at which the luminescent element E is disposed on the substrate 10. A light-shielding layer 81 is disposed at the surface of the substrate 80 facing the substrate 10. The light-shielding, layer 81 is composed of an opaque material, such as a black colored resin or a metal, e.g., chromium. As shown in FIGS. 5 and 6, the light-shielding layer 81 includes a portion overlapping the region A2 in the opening when viewed in the direction perpendicular to the substrate 10. The light-shielding layer 81 according to this embodiment is arranged in a grid in response to the pixels P similar to the auxiliary lead 70 exemplified in FIG. 4 and completely covers the opening of the contact hole CH. Thus, the light-shielding, layer 81 completely covers the auxiliary lead 70. Furthermore, the light-shielding layer 81 according to this embodiment is composed of a material having lower light reflectivity than the drain electrode 34 and the auxiliary lead 70.

In this structure, undesirable reflection reflected from the surface of the drain electrode 34 and then traveling in the region A2 is blocked by the light-shielding layer 81. Thus, although the auxiliary lead 70 only covers the region A1, the same effect as that in the first embodiment is surely achieved.

Furthermore, in this embodiment, the light-shielding layer 81 composed of a material having a lower light reflectivity than the auxiliary lead 70 overlaps the auxiliary lead 70. In this structure, external light traveling from the viewing side to the auxiliary lead 70 is blocked by the light-shielding layer 81. Furthermore, even if external light reaches the auxiliary lead 70, reflection from the surface is blocked by the light-shielding layer 81. Thus, even when the auxiliary lead 70 is composed of a material having a high light reflectivity, the nonuniformity of the quantity of light due to the reflection from the auxiliary lead 70 is suppressed. That is, according to this embodiment, it is possible to prevent the emergence of the reflection (undesirable reflection) from the drain electrode 34 and the auxiliary lead 70 to the viewing side.

C: Third Embodiment

Figure 8:
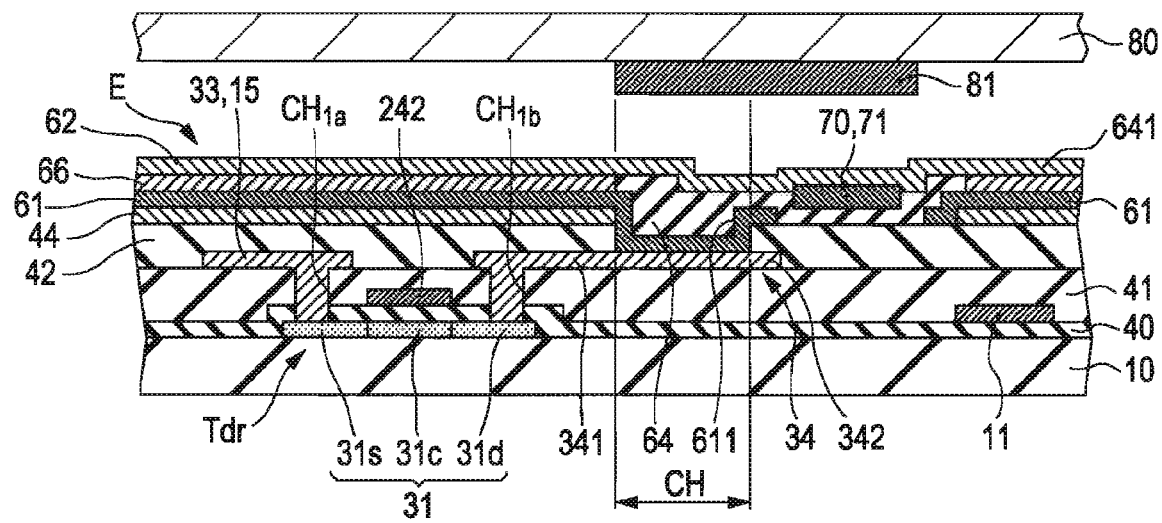
FIG. 8 is a cross-sectional view taken along line VIII-VIII in FIG. 7.

FIG. 7 is a plan view of the structure of a pixel P according to a third embodiment of the invention. FIG. 8 is a cross-sectional view taken along line VIII-VIII in FIG. 7. In each of the first and second embodiments, the structure in which the auxiliary lead 70 overlaps the contact hole CH when viewed in the direction perpendicular to the substrate 10 is exemplified. In contrast, as shown in FIGS. 7 and 8, the auxiliary lead 70 according to this embodiment does not overlap the opening.

As shown in FIG. 8, the insulating portion 64 according to this embodiment extends from the inside the contact hole CH toward the negative direction of the Y-direction and overlaps the periphery of the first electrode 61 of the subsequent pixel P disposed in the negative direction of the Y-direction. A portion 641 of the insulating portion 64 not overlapping the contact hole CH, i.e., a portion is in the negative direction of the Y-direction with respect to the contact hole CH, is disposed on the second insulating layer 42; hence, the portion 641 is flat compared with the portion of the insulating portion 64 overlapping the contact hole CH. As shown in FIGS. 7 and

8, the auxiliary lead 70 is disposed on the surface (flat surface) of the portion 641. The second electrode 62 covers the auxiliary lead 70.

In this embodiment, similarly to the second embodiment, the light-shielding layer 81 is disposed on the substrate 80. The light-shielding layer 81 is composed of an opaque material having a lower light reflectivity than the drain electrode 34 and the auxiliary lead 70. As shown in FIGS. 7 and 8, the light-shielding layer 81 covers both the contact hole CH and the auxiliary lead 70 when viewed in the direction perpendicular to the substrate 10. Thus, also in this embodiment, the same effect as that in the first and second embodiments is achieved.

In some cases, bumps in response to the shape (recess) of the contact hole CH are generated on the surfaces of the elements (insulating portion 64 and second electrode 62) covering the contact hole CH. Thus, in a structure in which the auxiliary lead 70 is disposed on the elements, the auxiliary lead 70 may be broken or detached due to the bumps on the surface. In contrast, in this embodiment, the auxiliary lead 70 is disposed on the surface of the flat portion 641 of the insulating portion 64, the flat portion 641 being remote from the contact hole CH. Therefore, it is possible to effectively prevent the breakage and detachment of the auxiliary lead 70.

D: Fourth Embodiment

Figure 9:
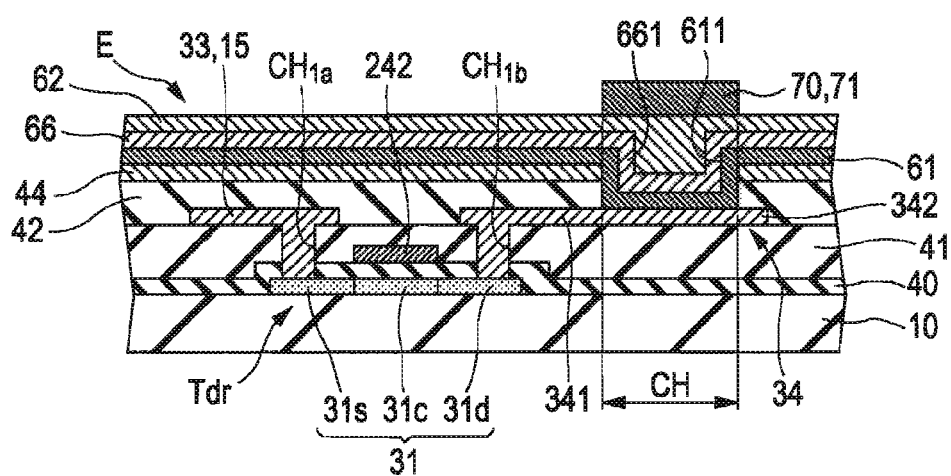
FIG. 9 is a cross-sectional view showing the structure of a pixel according to a fourth embodiment of the invention.
Figure 8:
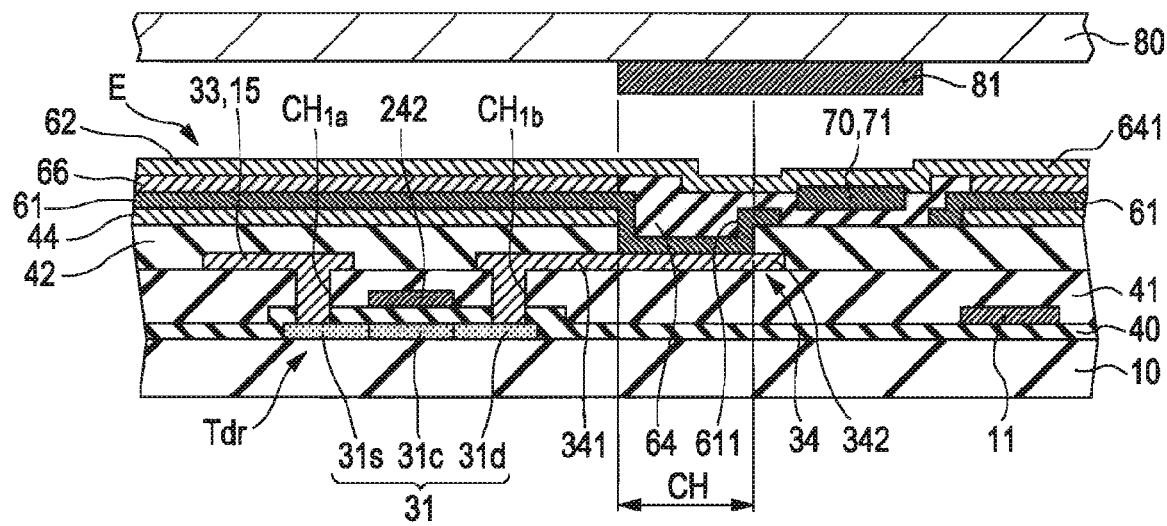
Figure 9:
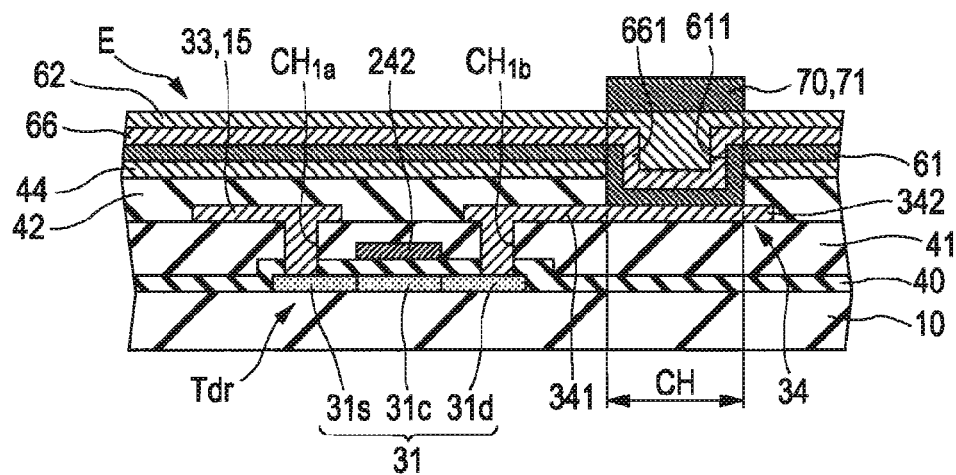

FIG. 9 is a cross-sectional view showing the structure of a pixel P according to a fourth embodiment of the invention. The pixel P according to this embodiment is the same planar structure as that in FIG. 2. That is, FIG. 9 corresponds to a cross-sectional view taken along line III-III in FIG. 2.

As shown in FIG. 9, in the emissive device D according to this embodiment, the insulating portion 641 with which the contact hole CH is filled is not disposed. The luminescent layer 66 is disposed across the substrate 10 so as to continuously extend over the plurality of the pixels P. The first electrodes 61 are disposed the respective pixels P, the first electrodes 61 being separated each other. Thus, although the luminescent layer 66 extends over the plurality of the pixels P, the quantity of light of the luminescent layer 66 is controlled for every pixel P similar to the above-described embodiments.

In the structure in which each individual luminescent layer 66 is separated for every pixel P as in the first to third embodiments, it is possible to change an emission color from each pixel P by appropriately selecting the material of the luminescent layer 66. However, in a structure in which the luminescent layer 66 extends over the plurality of the pixels P as in this embodiment, the emission color from the luminescent layer 66 cannot be changed for every pixel P. Thus, to realize an image display including a plurality of colors in the structure according to this embodiment, for example, a color filter in response to the pixels P is preferably disposed on the substrate 80 (not shown in FIG. 9).

As shown in FIG. 9, the portion of the luminescent layer 66 covering the contact hole CH is disposed inside the recess 611l of the first electrode 61 (space in the contact hole CH) and is in contact with the inner periphery and the bottom of the recess 611. The luminescent layer 66 has a sufficiently thinner thickness compared with the external dimension of the contact hole CH, thereby forming a recess (depression) of the luminescent layer 66 in response to the bump of the recess 611 of the first electrode 61.

The auxiliary lead 70 (in more detail, the first portions 71) is disposed on the surface of the second electrode 62 so as to completely cover the opening of the contact hole CH when viewed in the direction perpendicular to the substrate 10), as in the first embodiment. Thus, also in this embodiment, the same effect as that in the first embodiment is achieved. In this embodiment, it is possible to simultaneously from the luminescent layers 66 of pixels P in a single step. Furthermore, there is no need to form the insulating portion 64 as in the first to third embodiments. Therefore, it is possible to simplify a production process and reduce production costs, as compared with the above-described embodiments.

As shown in FIG. 9, a portion 661 of the luminescent layer 66 covering the inner periphery of the recess 611 of the first electrode 61 is disposed between the first electrode 61 and the second electrode 62, in the same way as other portions. Therefore, light (undesirable light) is also emitted from the portion 661 in operation of the luminescent element E. The undesirable light has characteristics, such as the quantity of light and spectral characteristics, different from those of the light emitted from other portions. Thus, when the undesirable light emerges from the viewing side, the uniformity of light emission of the emissive device D is degraded. Furthermore, light emitted from the portions of the luminescent layer 66 other than the portion 661 and light emitted from the portion 661 interfere with each other. As a result, a specific colored light can emerge from the viewing side. In this embodiment, since the auxiliary lead 70 covers the contact hole CH, undesirable light traveling from the recess 611 toward the viewing side is blocked by the auxiliary lead 70. As described above, in this embodiment, it is possible to block both the undesirable reflection and the undesirable light to uniformize the quantity of light in the luminescent region.

E: Fifth Embodiment

Figure 10:
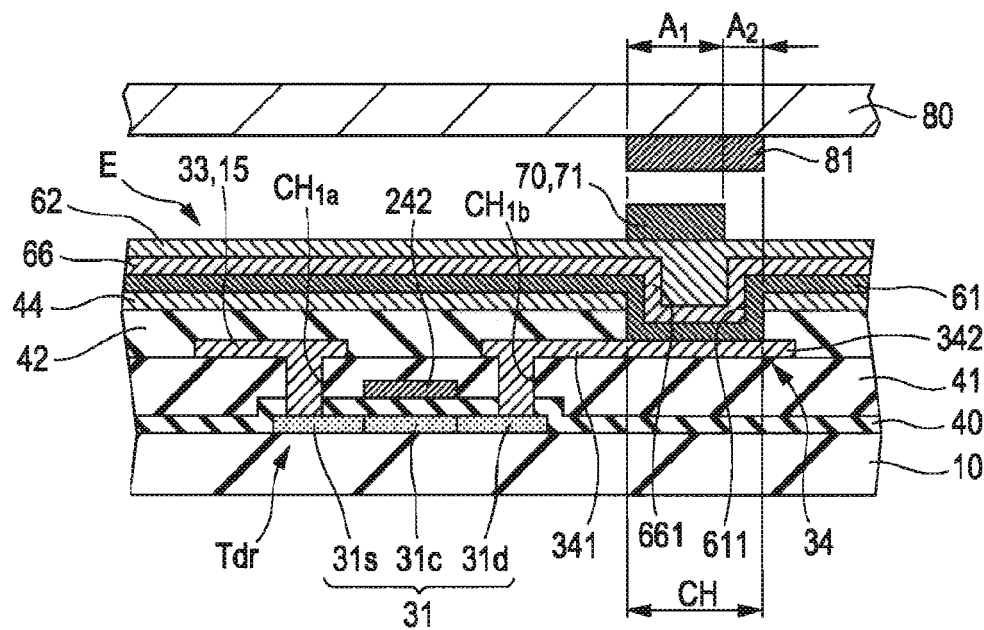
FIG. 10 is a cross-sectional view showing the structure of a pixel according to a fifth embodiment of the invention.

FIG. 10 is a cross-sectional view showing the structure of a pixel P according to a fifth embodiment of the invention. The pixel P according to this embodiment has the same planar structure as that in FIG. 5. The luminescent layer 66 according to this embodiment extends over the plurality of the pixels P and is disposed in the space inside the contact hole CH, as in the fourth embodiment (FIG. 9). The auxiliary lead 70 overlaps only the region A1 of the opening, and the light-shielding layer 81 completely covers the opening (region A1 and region A2) and is disposed on a surface of the substrate 80, as in the second embodiment (FIGS. 5 and 6). Thus, according to this embodiment, the same effect as in the second and fourth embodiments is achieved.

As described above, in the structure in which the light-shielding layer 81 is disposed at the viewing side with respect to the auxiliary lead 70, it is possible to reduce the influence of external light reflected from the surface of the auxiliary lead 70. In the structure in which the luminescent layer 66 is disposed inside the contact hole CH as in each of the fourth and fifth embodiments, for example, the undesirable light from the portion 661 is repeatedly reflected between the back surface of the auxiliary lead 70 (the surface adjacent to the substrate 10) and a drain electrode 342 or the reflective layer 44 to possibly emerge from the viewing side, in the end. From the standpoint of the prevention of the emergence of the undesirable light, a structure in which a light shield having a lower light reflectivity than the auxiliary lead 70, in other words, the structure in which the light shield having a higher light absorbance than the auxiliary lead 70, is disposed between the auxiliary lead 70 and the luminescent layer 66 (for example, between the auxiliary lead 70 and the second electrode 62 in FIGS. 9 and 10) is preferably used. In this structure, undesirable light emitted from the portion 661 of the luminescent layer 66 does not reach the back surface of the auxiliary lead 70; hence, it is possible to surely prevent the nonuniformity of the light emission due to the undesirable light reflected from the auxiliary lead 70.

F: Sixth Embodiment

Figure 11:
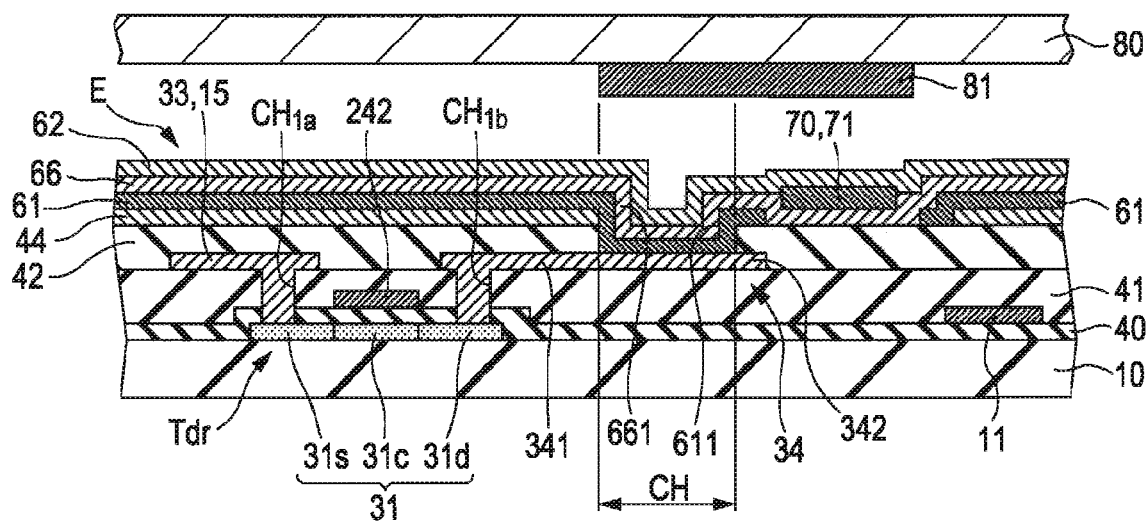
FIG. 11 is a cross-sectional view showing the structure of a pixel according to a sixth embodiment of the invention.

FIG. 11 is a cross-sectional view showing the structure of a pixel P according to a sixth embodiment of the invention. The pixel P according to this embodiment has the same planar structure as that in FIG. 7. The luminescent layer 66 according to this embodiment extends over the plurality of the pixels P and is disposed in the space inside the contact hole CH, as in the fourth embodiment (FIG. 9). The auxiliary lead 70 is disposed on the surface (flat surface) of the portion of the luminescent layer 66 not overlapping the contact hole CH, and the light-shielding layer 81 is disposed on a surface of the substrate 80 so as to overlap both the contact hole CH and the auxiliary lead 70, as in the third embodiment (FIGS. 7 and 8). Thus, according to this embodiment, the same effect as in the third and fourth embodiments is achieved.

G: Seventh Embodiment

Figure 12:
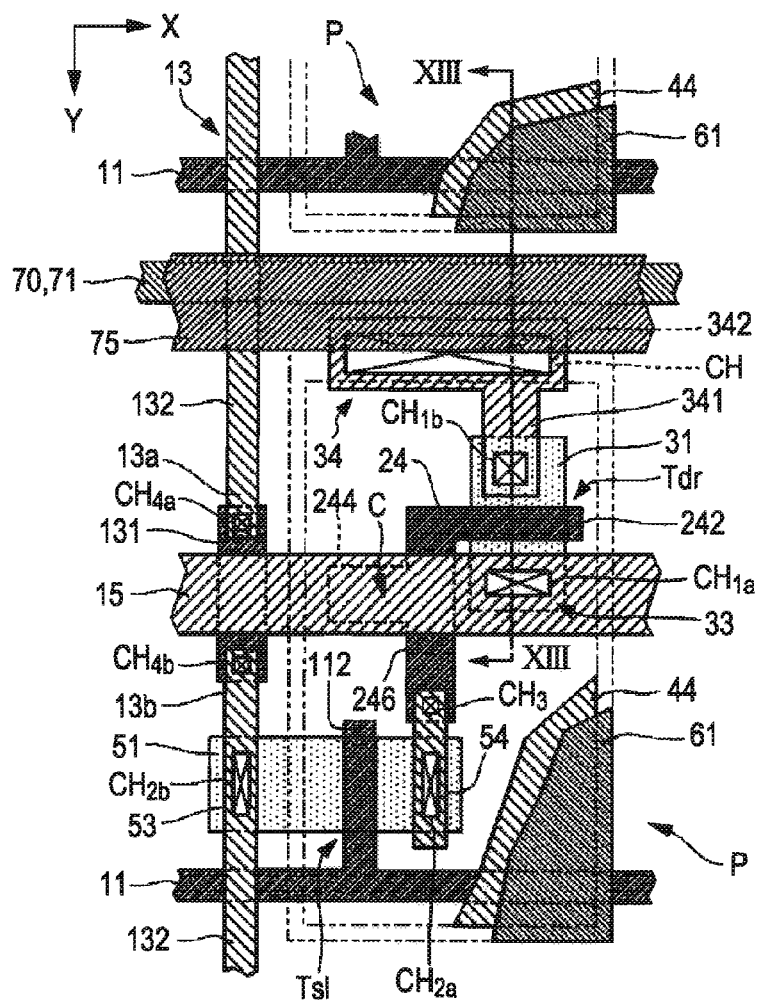
FIG. 12 is a plan view showing the structure of a pixel according to a seventh embodiment of the invention.
Figure 13:
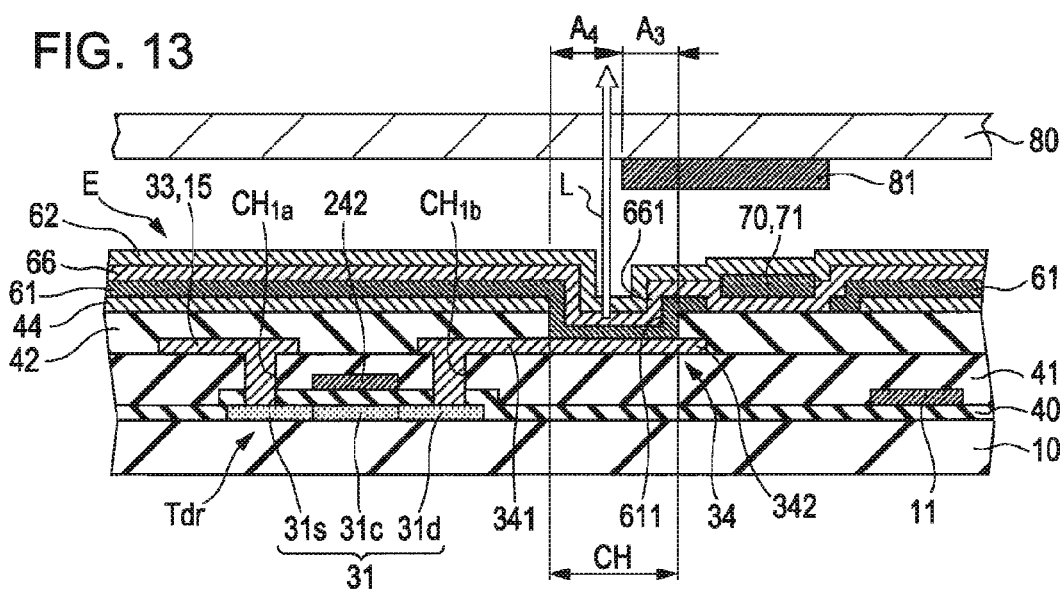
FIG. 13 is a cross-sectional view taken along line XIII-XIII in FIG. 12.

FIG. 12 is a plan view showing the structure of a pixel P according to a seventh embodiment of the invention. FIG. 13 is a cross-sectional view taken along line XIII-XIII in FIG. 12. As shown in FIGS. 12 and 13, the structure of the elements disposed on the substrate 10 is identical to the sixth embodiment (FIG. 11). The light-shielding layer 81 according to this embodiment covers a region A3, which is part of the opening, and the auxiliary lead 70 but does not cover a region A4, which is a region of the opening other than the region A3.

As shown in FIG. 13, light emitted from the portion of the luminescent layer 66 overlapping the contact hole CH (in particular, a portion covering the bottom of the recess 611) partially emerges from the viewing side through the region A4 as indicated by Arrow L in FIG. 13. Therefore, according to this embodiment, the region A4 contributes to an increase in aperture ratio, as compared with the structure in the sixth embodiment.

H: Eighth Embodiment

Figure 14:
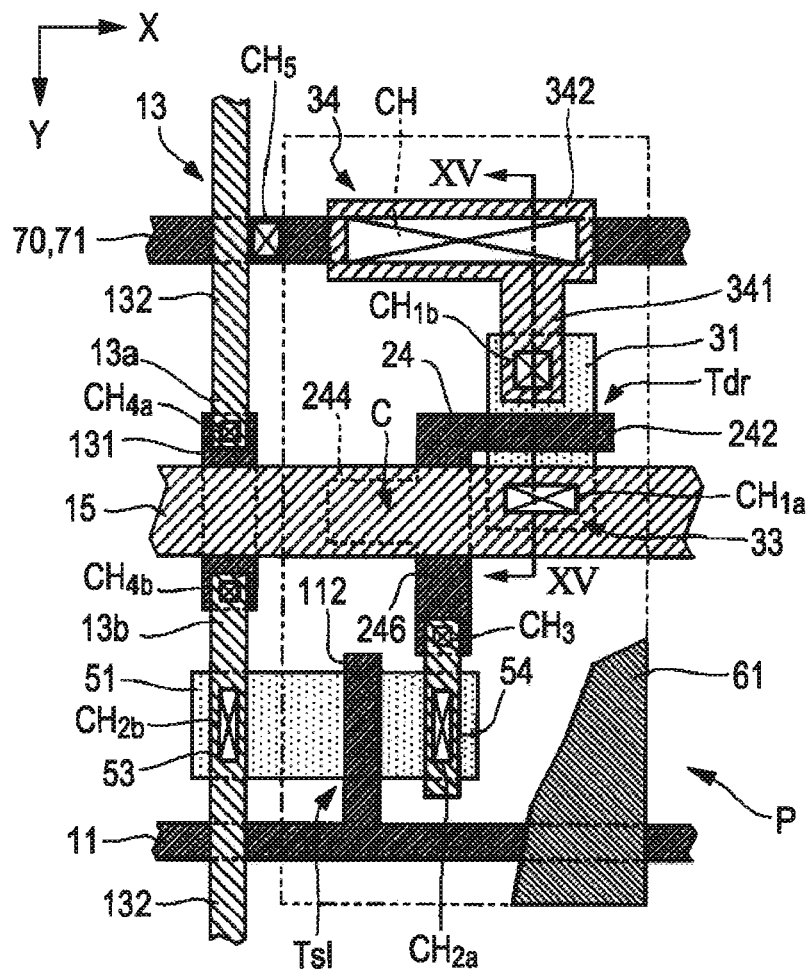
FIG. 14 is a plan view showing the structure of a pixel according to an eighth embodiment of the invention.
Figure 15:
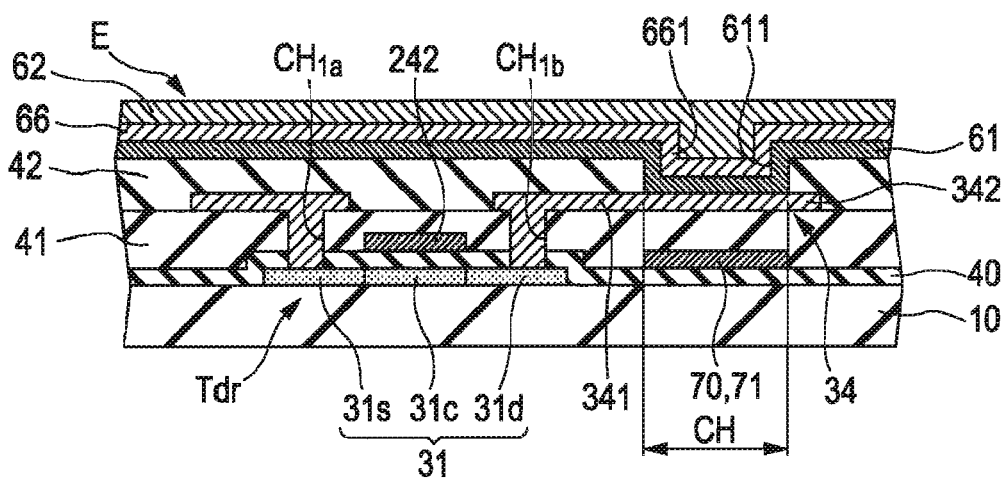
FIG. 15 is a cross-sectional view taken along line XV-XV in FIG. 14.

FIG. 14 is a plan view showing the structure of a pixel P according to an eighth embodiment of the invention. FIG. 15 is a cross-sectional view taken along line XV-XV in FIG. 14. In the above-described embodiments, top-emission-type emissive device D is exemplified. In contrast, the emissive device D according to this embodiment is of a bottom emission type. That is, as shown in FIG. 15, the reflective layer 44 described above is not disposed. The second electrode 62 is composed of a light reflective conductive material in place of the reflective layer 44. Thus, light emitted from the luminescent layer 66 toward the substrate 10 and light emitted from the luminescent layer 66 toward a side opposite the substrate 10 and then reflected from the surface of the second electrode 62 pass though the first electrode 61 and the substrate 10 to emerge downward in FIG. 15.

Also in this embodiment, the auxiliary lead 70 is used as a light shield for preventing the emergence of reflection from the drain electrode 34, as in the first and second embodiments. In this embodiment, the substrate 10 side (lower side in FIG. 15) is the viewing side with respect to the luminescent layer 66. As shown in FIG. 15, the auxiliary lead 70 is disposed between the drain electrode 34 and the substrate 10. The auxiliary lead 70 according to this embodiment and the gate electrode 242 (furthermore, the selection lines 11 and the intersection portion 131) is simultaneously formed by patterning a single conductive film entirely disposed on the substrate 10. Thus, the auxiliary lead 70 is composed of the same material as that of the gate electrode 242.

The auxiliary lead 70 overlaps the drain electrode 34 (in more detail, the opening of the contact hole CH) when viewed in the direction perpendicular to the substrate 10 like FIG. 14. As shown in FIG. 14, the second electrode 62 is electrically connected to the auxiliary lead 70 via a contact hole CH5 passing through the first insulating layer 41 and the second insulating layer 42. Also according to this structure, the same effect as that in the first and second embodiments is achieved. For example, in this embodiment, external light emitted from the viewing side (lower side in FIG. 15) toward the drain electrode 34 and undesirable light reflected from the surface of the drain electrode 34 toward the viewing side are blocked by the auxiliary lead 70, thereby uniformizing the quantity of light in the plane in the luminescent region.

The auxiliary lead 703 according to this embodiment is formed by the same process as that for forming the gate electrode 242 (furthermore, selection lines 11 and the intersection portion 131). In this structure, there is no need for the formation and patterning of a conductive film used for only forming the auxiliary lead 70. Therefore, it is possible to simplify the production process and reduce production costs, as compared with the case where the auxiliary lead 70 is formed by a process separate from a process for forming another element. Furthermore, in this embodiment, there in no need for the formation of the auxiliary lead 70 on the surface of the luminescent layer 66 and the insulating portion 64, the luminescent layer 66 and the insulating portion 64 being composed of organic materials. Moreover, the auxiliary lead 70 is composed of a low-resistance conductive material common to the gate electrode 242. Thus, advantageously, the resistance of the auxiliary lead 70 is easily reduced, as compared with the case where the auxiliary lead 70 is disposed on surfaces of the luminescent layer 66 and the insulating portion 64.

As described above, the bottom-emission-type emissive device D is exemplified. In this embodiment, the emissive device D may be of a top emission type. In the top-emission-type emissive device D, the reflective layer 44 is disposed between the first electrode 61 and the substrate 10. The second electrode 62 is composed of an optically transparent material. According to this structure, an increase in the area of the contact hole CH does not lead to a reduction in aperture ratio within the range of the region covered with the auxiliary lead 70, as in the first embodiment. Thus, it is possible to sufficiently ensure the area of the contact hole CH and to reduce the resistance of the contact area between the driving transistor Tdr and the first electrode 61. Furthermore, in the top-emission-type emissive device D in which the auxiliary lead 70 is disposed under the first electrode 61 as shown in FIGS. 14 and 15, even when the auxiliary lead 70 is composed of an opaque material, light emitted from the luminescent layer 66 does not blocked by the auxiliary lead 70. Therefore, it is possible to advantageously increase the aperture ratio.

I: Ninth Embodiment

In each of the above-described embodiments, the auxiliary lead 70 (FIG. 4) arranged in a grid in response to the rows and columns of the pixels P is exemplified. The structure of the auxiliary lead 70 may be appropriately changed. In this embodiment, one auxiliary lead 70 is disposed with respect to a plurality of rows or a plurality of columns.

Figure 16:
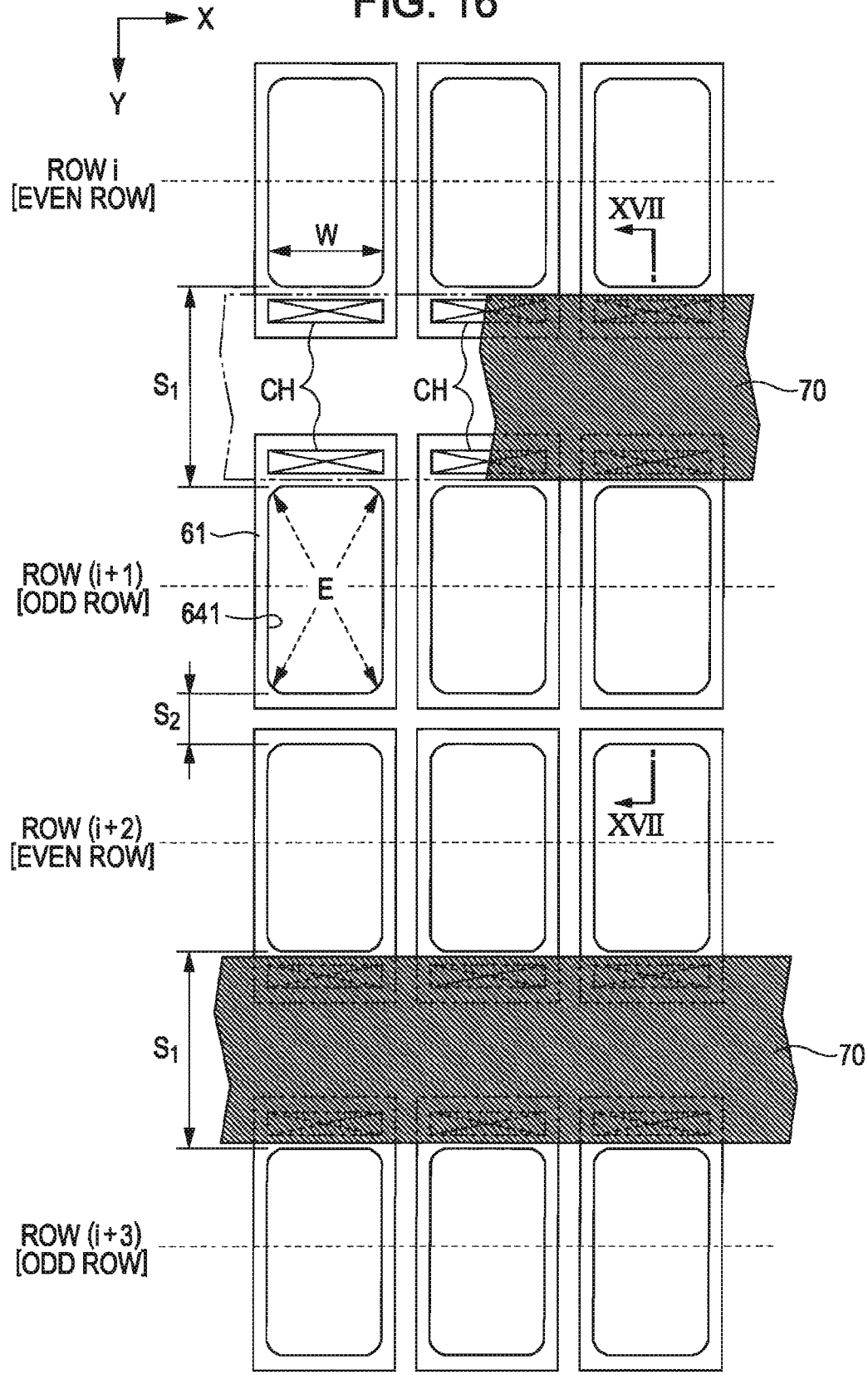
FIG. 16 is a plan view showing the arrangement of pixels according to a ninth embodiment of the invention.
Figure 17:
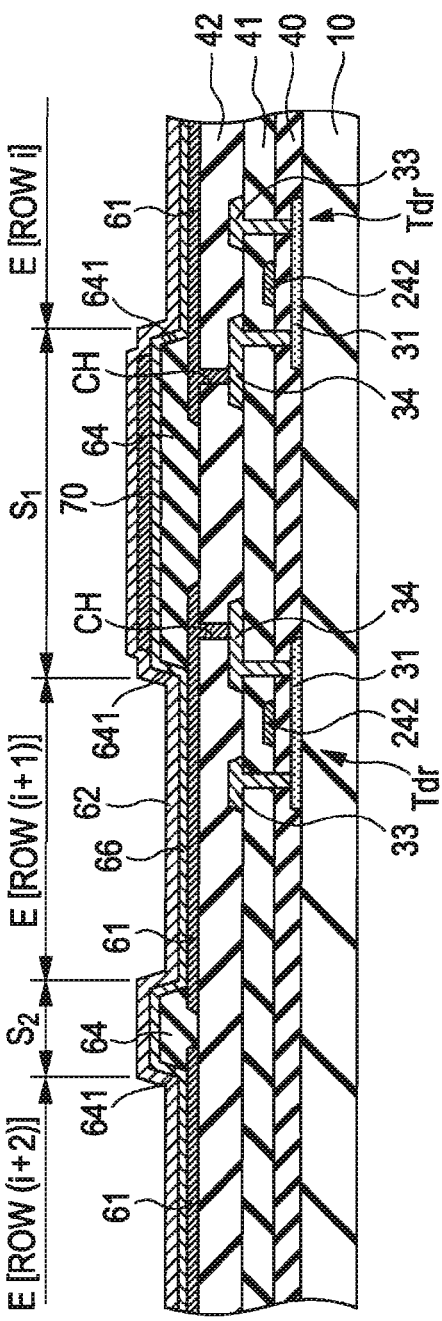
FIG. 17 is a cross-sectional view taken along line XVII-XVII in FIG. 16.

FIG. 16 is a plan view showing the arrangement of a plurality of luminescent elements E according to a ninth embodiment of the invention. FIG. 17 is a cross-sectional view taken along line XVII-XVII in FIG. 16. In FIGS. 16 and 17, the elements, such as the selection transistor Tsl and the capacitor C, are appropriately omitted.

Similarly to each of the above-described embodiments, the first electrodes 61 each having a substantially rectangular shape and each having a length in the Y-direction are arrayed in a matrix of the X-direction and the Y-direction on the surface of the second insulating layer 42. In this structure, the reflective layer 44 described in each of the above-described embodiments is omitted.

The insulating portion 64 is disposed on the surface of the first electrode 61 on the second insulating layer 42. As shown in FIGS. 16 and 17, an opening 641 (hole passing through the insulating portion 64 along the thickness) is disposed in each of the regions of the insulating portion 64 overlapping the first electrode 61. As shown in FIG. 16, the entire inner periphery of the opening 641 is located inwardly compared with the perimeter of the first electrode 61, when viewed in the direction perpendicular to the substrate 10. As described above, in fact, the perimeter of the first electrode 61 is covered with the insulating portion 64. However, in FIG. 16, for the sake of convenience, the contour of the first electrode 61 is illustrated using a solid line.

As shown in FIG. 17, the luminescent layer 66 is continuously disposed over the plurality of the luminescent elements E so as to completely cover the surface of the second insulating layer 42 having the insulating portion 64. That is, the luminescent layer 66 includes a portion (luminescent portion) disposed in the opening 641 and opposite the first electrode 61; and a portion disposed on the surface of the insulating portion 64.

As shown in FIG. 17, the second electrode 61 is a conductive film continuously formed over the plurality of the luminescent elements E, the second electrode 62 covering the luminescent layer 66 and the insulating portion 64. That is, the second electrode 62 includes a portion disposed in the opening 641 and opposite the first electrode 61 provided with the luminescent layer 66 therebetween; and a portion disposed on the insulating portion 64. As shown in FIGS. 16 and 17, in a laminate having the first electrode 61, the luminescent layer 66, and the second electrode 62, a portion disposed inside the inner periphery of the opening 641, in other words, a region in which a current flows from the first electrode 61 to the second electrode 62 is defined as the luminescent element E, when viewed in the direction perpendicular to the substrate 10. A region of the luminescent layer 66 overlapping the insulating portion 64 does not illuminate because a current is blocked by the insulating portion 641 disposed between the first electrode 61 and the second electrode 62. That is, the insulating portions 64 define outlines of the luminescent elements E.

As shown in FIGS. 16 and 17, the plurality of auxiliary leads 70 extending in the X-direction are each disposed between the insulating portion 64 (luminescent layer 66) and the second electrode 62. A specific structure of each auxiliary lead 70 according to this embodiment is described below. Three rows of the luminescent elements E, i.e., row i to row (i+3) of the luminescent elements E are shown in FIG. 16. Row i and row (i+2) are defined as even rows. Row (i+1) and row (i+3) are defined as odd rows.

As shown in FIG. 16, each auxiliary lead 70 is disposed at space S1 between the luminescent elements E of an even row and the luminescent elements E of an odd row adjacent to the even row in the positive direction of the Y-direction (for example, space S1 between row i and row (i+1) and space S1 between row (i+2) and row (i+3)). On the other hand, none of the auxiliary leads 70 is disposed at space 82 between the luminescent elements E of an odd row and the luminescent elements E of an even row adjacent to the odd row in the positive direction of the Y-direction. That is, when two rows of an odd row and an even row adjacent to the odd row in the positive direction of the Y-direction are defined as a unit, each auxiliary lead 70 is disposed at space S1, which is a space between adjacent units in the Y-direction. None of the auxiliary leads 70 is disposed at space 82, which is a space between adjacent rows defining the unit. Consequently, in this embodiment, one auxiliary lead 70 is disposed with respect to a plurality of rows (for every two rows).

The contact hole CH for connecting the first electrode 61 with the driving transistor Tdr of each luminescent element E is disposed adjacent to the auxiliary lead 70 with respect to the luminescent element E. Thus, the position of the contact hole CH in the Y-direction in each luminescent element E of an odd row is opposite the position of the contact hole CH in each luminescent element E of an even row. That is, in an even row, the contact hole CH is disposed at a positive side of each luminescent element E in the Y-direction. In contrast, in an odd row, the contact hole CH is disposed at a negative side of each luminescent element E in the Y-direction.

As shown in FIGS. 16 and 17, the auxiliary leads 70 each has a width substantially identical to the width of the insulating portion 64 to cover space S1 between the luminescent elements E and to cover the contact holes CH as in the first and second embodiments. That is, the auxiliary leads 70 each cover the contact hole CH of each luminescent element E of an even row and the contact hole CH of each luminescent element E of an odd row adjacent to the even row in the positive direction of the Y-direction. In other words, one edge of each auxiliary lead 70 in the width direction (the upper end portion in FIG. 16) is located at a space between each luminescent element E of an even row and the corresponding contact hole CH. The other edge is located at a space between each luminescent element E of an odd row and the corresponding contact hole CH.

Each auxiliary lead 70 deviates from a design position for reasons of production techniques, in some cases. When the auxiliary lead 70 is formed by evaporation with a mask (described in detail below), the auxiliary lead 70 is formed at a position different from a predetermined position (design position), in some cases, because of the dimension error of the mask and the positional error between the substrate 10 and the mask. Even if the auxiliary lead 70 has a positional error, a gap (hereinafter, referred to as a "margin region") is ensured between the design position of the auxiliary lead 70 and each luminescent element E adjacent to the auxiliary lead 70 in the width direction such that the auxiliary lead 70 does not overlap the luminescent element E when viewed in the direction perpendicular to the substrate 10 (that is, the aperture ratio is not reduced).

As described above, in this embodiment, since one auxiliary lead 70 is disposed for every two rows, the total area of a region at which the auxiliary leads 70 are disposed and the margin region in the luminescent region is reduced, as compared with the structure in which the auxiliary leads 70 are disposed at all spaces between adjacent rows and between adjacent columns (for example, the structure shown in FIG. 4; hereinafter, the structure being referred to as a "comparative structure") as in the first embodiment. Thus, advantageously, the structure according to this embodiment easily achieves a balance between the maintenance of the aperture ratio and a reduction in the resistance of the auxiliary lead 70. That is, for example, in the case where the aperture ratio is maintained at a level equal to that of the comparative structure, each auxiliary lead 70 surely has a greater line width compared with the comparative structure because the number of the auxiliary leads 70 and tile areas of the margin regions are reduced; hence, the resistance of each auxiliary lead 70 can be reduced. Furthermore, in this embodiment, many contact holes CH are densely arranged in the space between the sequence of the luminescent elements E of an even row and the sequence of the luminescent elements E of an odd row adjacent to the even row in the positive direction of the Y-direction. Thus, an increase in the line width of each auxiliary lead 70 can easily cover the contact holes CH with the corresponding auxiliary lead 70. On the other hand, in the case where the line width of each auxiliary lead 70 is maintained at a level equal to that of the comparative structure, the area of each luminescent element E is surely increased because of the reduced areas of the auxiliary leads 70 and the margin regions in the luminescent region. Therefore, the structure according to this embodiment can have a greater aperture ratio than the comparative structure. Furthermore, the increased aperture ratio results in a reduction in electrical energy (current) to be fed to the luminescent elements E for emitting light with a predetermined quantity of light from the luminescent region. Therefore, the life of the luminescent elements E can be advantageously prolonged by suppressing degradation due to the feed of the electrical energy.

In a process for producing the emissive device D according to the embodiment, a step of forming the auxiliary leads 70 will be described below. The auxiliary leads 70 according to the embodiment are formed by evaporation (vacuum evaporation) using a mask. Elements other than the auxiliary leads 70 are formed by known techniques.

Figure 18:
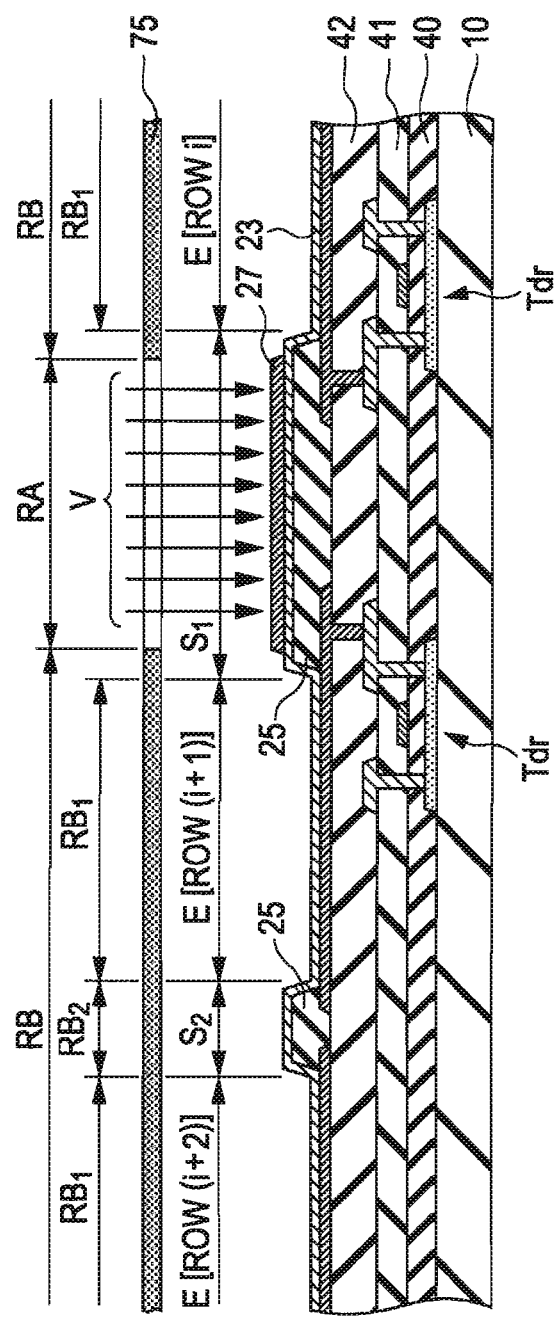
FIG. 18 is a cross-sectional view illustrating a step of forming auxiliary leads.

FIG. 18 is a cross-sectional view illustrating a step of forming the auxiliary leads 70 (corresponding to FIG. 17). As shown in FIG. 18, a mask 75 for use in evaporation is prepared before the formation of the auxiliary leads 70. The mask 75 has an opening at a region RA and an unperforated region RB other than the region RA. The region RA is in the form of a slit extending in the X-direction, the slit facing a region for forming each auxiliary lead 70. The region RA faces the space S1 between an even row (row i or row (i+2)) and an odd row adjacent to the even row (row (i+1) or row (i+3)) in the positive direction of the Y-direction (to be more exact, a region obtained by the elimination of the margin regions from space S1). On the other hand, the region RB includes a subregion RB1 and a subregion RB2. The subregion RB1 faces the luminescent elements E. The subregion RB2 faces space 82 between an odd row (row (i+1)) and an even row (row (i+2)) adjacent to the odd row in the positive direction of the Y-direction.

The auxiliary leads 70 are formed by evaporation using the mask 75. As shown in FIG. 18, an emissive device D having the luminescent layer 66 (before forming the second electrode 62) is placed in vacuum. The mask 75 is placed so as to face the luminescent layer 66. The vapor V of a material having a lower resistivity than the second electrode 62 is selectively deposited on the surface of the luminescent layer 66 to form the auxiliary leads 70 having the shape shown in FIG. 16.

In the emissive device D according to the embodiment, one auxiliary lead 70 is disposed for every two rows of the luminescent elements E. Thus, as shown in FIG. 18, there is no need for perforating the region RB2 of the mask 75. That is, it is possible to maintain the mechanical strength of the mask 75, as compared with the case where the auxiliary leads 70 are disposed at all spaces between adjacent rows like the comparative structure (the case where openings each having the same width dimension as the region RA are also formed in the region RB2 of the mask 75). Therefore, it is possible to effectively prevent the error and failure of the auxiliary leads 70 due to the deformation of the mask 75 (for example, deformation due to its own weight). Furthermore, since the error of the auxiliary leads 70 is reduced, each auxiliary lead 70 can easily cover the contact holes CH with high precision.

Figure 19:
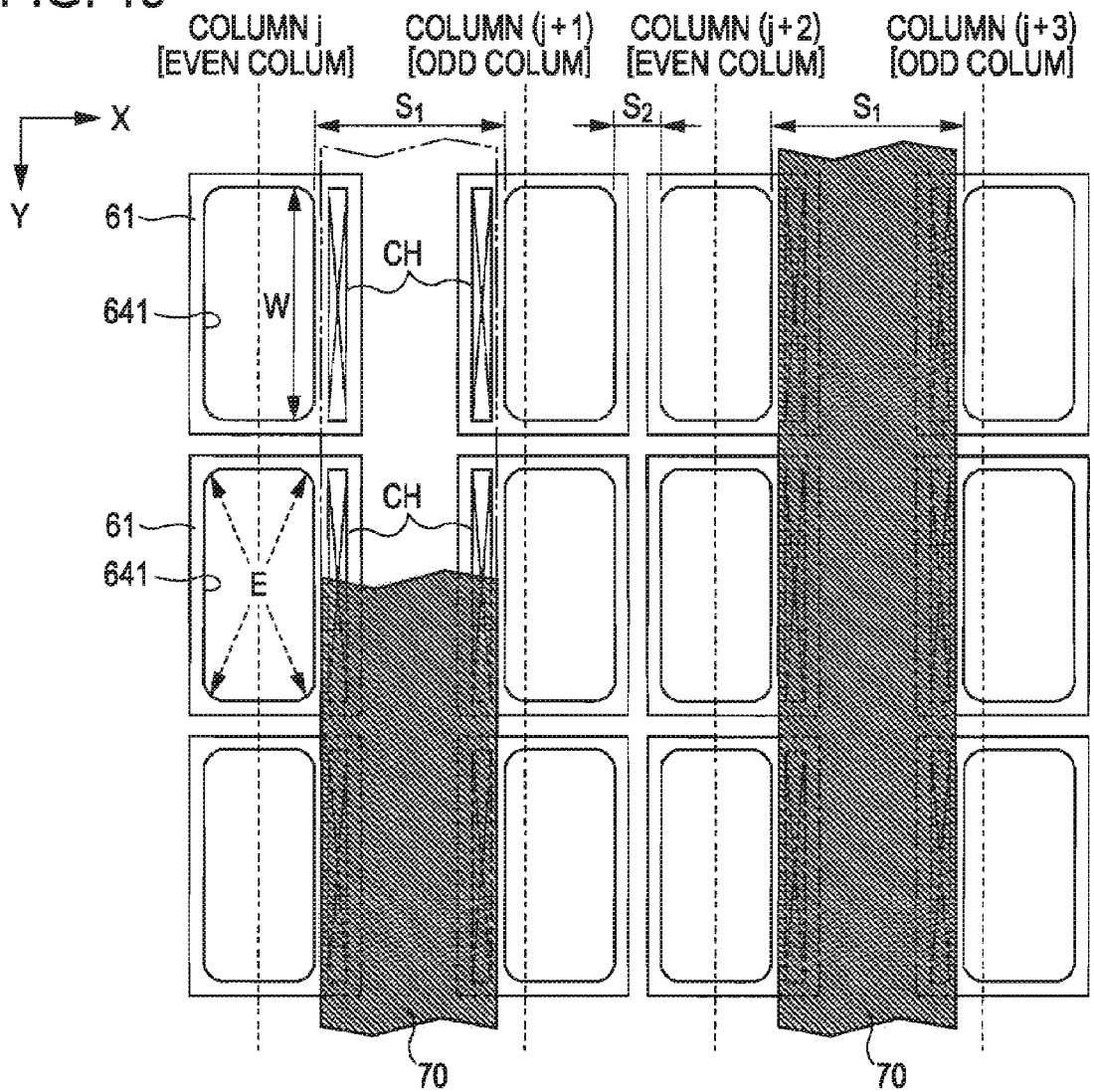
FIG. 19 is a plan view showing the arrangement of the pixels according to another aspect of the ninth embodiment.

In FIG. 16, the structure in which each auxiliary lead 70 extends along the short side of each luminescent element E (X-direction) is exemplified. As shown in FIG. 19, a structure in which each auxiliary lead 70 extends along the long side of each luminescent element E (Y-direction) may be used. Three columns of the luminescent elements E, i.e., column j to column (j+3) of the luminescent elements E are shown in FIG. 19. Column j and column (j+2) are defined as even columns. Column (j+1) and column (j+3) are defined as odd column.

As shown in FIG. 19, in this embodiment, one auxiliary lead 70 is disposed with respect to a plurality of columns (for every two columns). That is, each auxiliary lead 70 extending in the Y-direction is disposed at space S1 between column j and column (j+1) and space S1 between column (j+2) and column (j+3), whereas none of the auxiliary leads 70 is disposed at space S2 between column (j+1) and column (j+2). Furthermore, each auxiliary lead 70 covers contact holes CH of the luminescent elements E disposed at both sides of the auxiliary lead 70. Also in the structure shown in FIG. 19, the same effect as that of the structure shown in FIG. 16 is achieved.

The resistance of a current path from each luminescent element E to the corresponding auxiliary lead 70 (hereinafter, the resistance being referred to as a "cathode resistance") is inversely proportional to the dimension W of each luminescent element E in the direction to which each auxiliary lead 70 extends (see FIGS. 16 and 19). In the structure shown in FIG. 19, since the auxiliary leads 70 each extend along the long side of each luminescent element E, the dimension W can be increased, as compared with the structure in which the auxiliary leads 70 each extend along the short side of each luminescent element E shown in FIG. 16. Thus, the structure shown in FIG. 19 reduces the cathode resistance compared with that in the structure shown in FIG. 16. This suppresses the voltage drop across the second electrode 62; hence, the power-supply potential Vdd required for driving the luminescent elements E can be reduced compared with the case of high cathode resistance.

J: Modification

Various modifications of the above-described embodiments may be made. Specific modifications will be exemplified as follows. The modifications may be in combination.

(1) In the above-described embodiments, the structure in which the light-shielding layer 81 is disposed on the substrate 80 is exemplified. The position of the light-shielding layer 81 may be appropriately changed. For example, a structure in which the light-shielding layer 81 is disposed on the surface of the second electrode 62 may be used. Furthermore, in the structure in which the auxiliary lead 70 is disposed on the surface of the second electrode 62 (for example, the first, second, fourth, and fifth embodiments), the light-shielding layer 81 may be disposed on the surface of the auxiliary lead 70.

(2) In each of the second embodiment (FIGS. 5 and 6) and the fifth embodiment (FIG. 10), the structure in which the light-shielding layer 81 covers the region A2, not covered with the auxiliary lead 70, of the opening of the contact hole CH is exemplified. The light-shielding layer 81 may be omitted, if necessary. In such a structure not including the light-shielding layer 81, undesirable reflection from the region A2 emerges from the viewing side. In the fifth embodiment, undesirable light also emerges from the viewing side. However, since undesirable reflection and undesirable light from the region A1 are blocked by the auxiliary lead 70, the intended effect of suppressing the nonuniformity of quantity of light in the luminescent region is surely achieved, as compared with a known structure in which none of the light shields covers the contact hole CH.

In each of the first embodiment (FIGS. 2 and 3) and the fourth embodiment (FIG. 9), the structure in which the auxiliary lead 70 completely covers the opening of the contact hole CH is exemplified. To further surely prevent undesirable reflection and undesirable light, the light-shielding layer S1 including a portion overlapping the contact hole CH may be disposed. Furthermore, in the structure in which the light-shielding layer 81 at least partially overlaps the contact hole CH (for example, the second, third, fifth, sixth, and seventh embodiments), if the voltage drop due to the second electrode 62 does not cause problems, the auxiliary lead 70 may be omitted, according to need.

As described above, in the invention, a structure in which an opaque component (light shield) is disposed so as to overlap the contact hole CH when viewed in the direction perpendicular to the substrate 10 is needed, regardless of the structure of the light shield (auxiliary lead 70 or light-shielding layer 81) and the material (conductive, insulative, or the like). From the standpoint of the sure prevention of the nonuniformity of the quantity of light due to the contact hole CH, a structure in which the light shield extends over a range greater than the contact hole CH is preferred.

Figure 20:
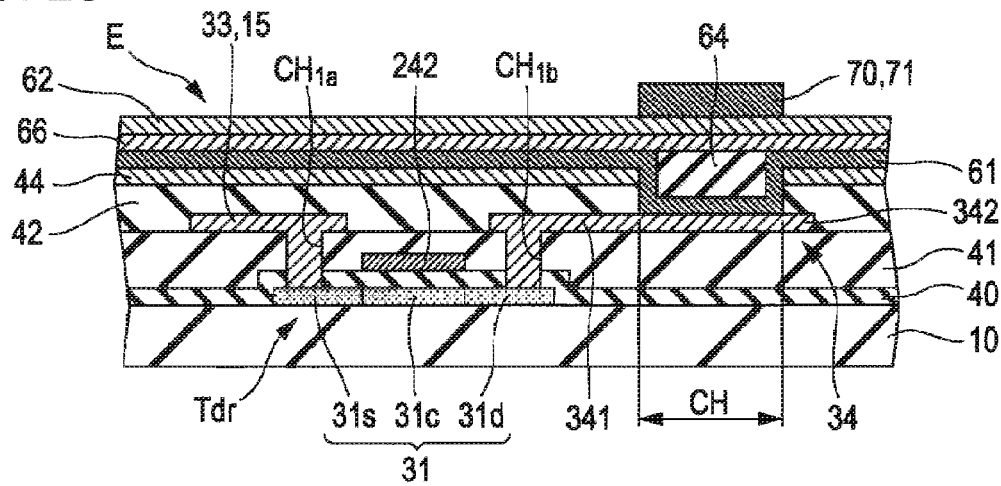
FIG. 20 is a cross-sectional view showing the structure of a pixel according to the modification of each embodiment.

(3) In each of the first to third embodiments, the structure in which the insulating portion 64 does not overlap the luminescent layer 66 is exemplified. As shown in FIG. 20, a structure in which the luminescent layer 66 covers the insulating portion 64 may be used. According to this structure, the luminescent layer 66 and the second electrode 62 are disposed on the flat surface of the insulating portion 64 with which the contact hole CH is filled. Thus, it is possible to prevent the failure and break of the luminescent layer 66 and the second electrode 62 due to bumps of the contact hole CH. Furthermore, the luminescent layer 66 is not disposed inside the recess 611 as in the first to third embodiments. Thus, the portion of the luminescent layer 66 covering the contact hole CH is remote from the first electrode 61 provided with the insulating portion 64 therebetween (that is, a current does not flow). Therefore, according to the structure shown in FIG. 20, it is possible to prevent the generation of the undesirable light which causes problems in each structure shown in FIGS. 9 to 13.

(4) In the eighth embodiment, the structure in which the auxiliary lead 70 is used to block undesirable reflection from the drain electrode 34 is exemplified. An element other than the auxiliary lead 70 may be used to block the undesirable reflection. For example, a structure in which an opaque film separate from the auxiliary lead 70 is disposed between the drain electrode 34 and the substrate 10 may be used. The auxiliary lead 70 in this structure may be disposed on the surface of the second electrode 62, as in the first embodiment.

(5) The above-described structure may be in combination, according to need. For example, in the third embodiment (FIGS. 7 and 8), a structure in which the light-shielding layer 81 is disposed so as not to overlap the region A4 of the opening of the contact hole CH may be used, as in the seventh embodiment (FIGS. 12 and 13).

(6) In each of the above-described embodiments, the structure in which the luminescent layer 66 is composed of an organic electroluminescent material is exemplified. The material of the luminescent layer 66 may be appropriately changed. For example, the luminescent layer may be composed of an inorganic electroluminescent material. The luminescent layer according to an aspect of the invention is required to be composed of a luminescent material that illuminates using electrical energy.

K: Applications

Figure 21:
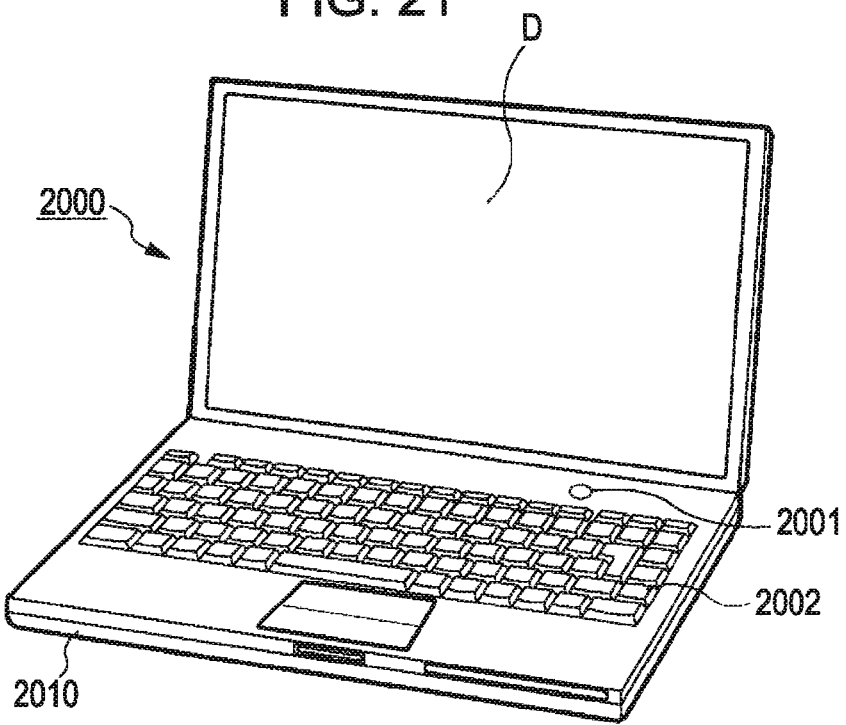
FIG. 21 is a perspective view showing an example of an electronic apparatus according to an aspect of the invention.

An electronic apparatus including an emissive device according to an aspect of the invention will be described below. FIG. 21 is a perspective view of a mobile personal computer including the emissive device D, which serves as a display device, according to any one of the embodiments. A personal computer 2,000 includes the emissive device D serving as the display device and a main body 2,010. The main body 2,010 includes a power switch 2,001 and a keyboard 2,002. The emissive device ID includes a luminescent element E composed of an organic electroluminescent material and thus has an easily viewable screen with a wide viewing angle.

Figure 22:
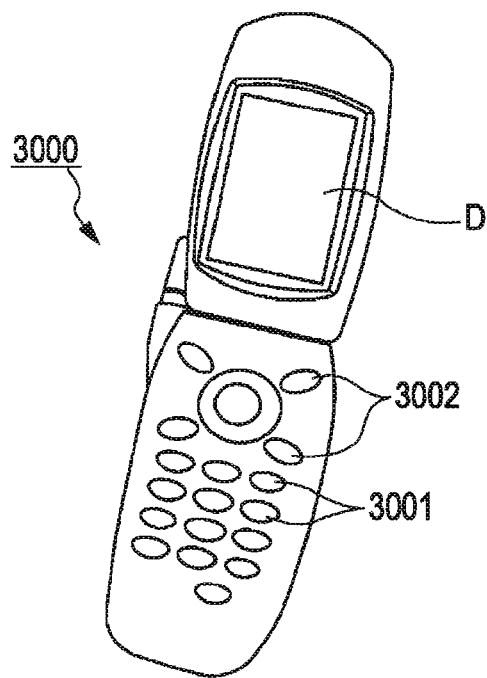
FIG. 22 is a perspective view showing an example of an electronic apparatus according to an aspect of the invention.

FIG. 22 shows a cellular phone including the emissive device D according to any one of the embodiments. A cellular phone 3,000 includes a plurality of operation buttons 3,001, a plurality of scroll buttons 3,002 and an emissive device D serving as a display. The scroll buttons 3,002 are operated to scroll an image on the screen.

Figure 23:
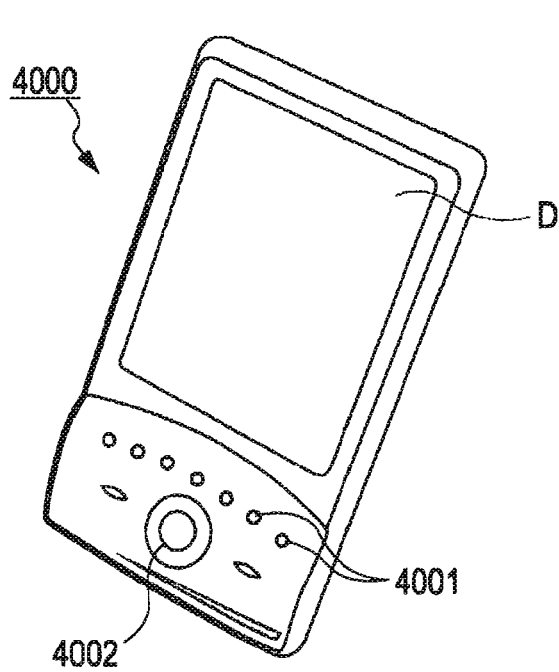
FIG. 23 is a perspective view showing an example of an electronic apparatus according to an aspect of the invention.

FIG. 23 shows a personal digital assistant (PDA) including the emissive device ID according to any one of the embodiments. A personal digital assistant 4,000 includes a plurality of operation buttons 4,001, a power switch 4,002, and the emissive device D serving as a display. Turning the power switch 4,002 on displays information, such as an address listing or a schedule book, on the emissive device D.

Examples of the electronic apparatus to which the emissive device according to an aspect of the invention is applied include digital still cameras, television sets, video cameras, car navigation systems, pagers, electronic notebooks, electronic paper, calculators, word processors, workstations, videophones, point-of-sale terminals, printers, scanners, copying machines, video players, and apparatuses with touch panels, in addition to apparatuses indicated in FIGS. 21 to 23. Furthermore, applications of the emissive device according to an aspect of the invention are not limited to displaying images. For example, in image-forming apparatuses, such as optical writing printers and electronic copying machines, writing heads for exposing photoreceptors in response to images to be formed on recording materials, such as printing paper, are used. The emissive device according to an aspect of the invention may be used as the writing head.

What is claimed is:

1. An emissive device, comprising:
   a substrate;
   a switching element over the substrate;
   a first insulating layer covering the switching element, the insulating layer defining a first contact hole;
   a first electrode over the insulating layer and electrically coupled to the switching element via the first contact hole;

a second insulating layer covering the first insulating layer, the second insulating layer defining a second contact hole;

a second electrode spaced from the first electrode;

a luminescent layer disposed between the first electrode and the second electrode; and a light shield entirely covering the second contact hole, the light shield serving as an auxiliary lead electrically coupled to the second electrode.

2. The emissive device according to claim 1, the switching element further including:

a switching element electrode extending to the second contact hole and having a portion not covered with the insulating layer, the portion being in contact with the first electrode; and the light shield being composed of a material having a lower light reflectivity than a light reflectivity of the switching element electrode.

3. The emissive device according to claim 1, the light shield being composed of a conductive material having a lower resistivity than the second electrode.

4. The emissive device according to claim 3, an inner periphery of the second contact hole defining a contact hole region extending in a direction perpendicular to an axial direction of the second contact hole, the auxiliary lead completely covering the second contact hole region relative to the axial direction of the second contact hole.

5. The emissive device according to claim 3, the second contact hole extending in an axial direction in plan view, an inner periphery of the second contact hole defining a contact hole region extending in a direction perpendicular to the axial direction of the second contact hole, the auxiliary lead partially overlapping the second contact hole region relative to the axial direction of the second contact hole, the emissive device further comprising:

a light-shielding layer having a portion overlapping a region that does not overlap the auxiliary lead in the contact hole region.

6. The emissive device according to claim 3, further comprising:

a plurality of luminescent elements, each of the luminescent elements including the first electrode, the second electrode, and the luminescent layer;

a plurality of element groups, each of the element groups including at least one of the luminescent elements arranged in a first direction and at least two of the luminescent elements arranged in a second direction that intersects the first direction, the plurality of the element groups being arranged in the second direction, the auxiliary lead being disposed in a space between a first element group and a second element group that is adjacent to the first element group in the second direction, the auxiliary lead extending in the first direction, the auxiliary lead not being disposed in a space between the at least two luminescent elements of each element group arranged in the second direction.

7. The emissive device according to claim 1, further comprising:

an insulating portion composed of an insulating material, the insulating portion filling at least a portion of the second contact hole;

the luminescent layer being spaced from the second contact hole.

8. The emissive device according to claim 1, the light shield extending in a predetermined direction that is perpendicular to an axial direction of the second contact hole; and the second contact hole extending along the predetermined direction.

9. The emissive device according to claim 1, the first electrode transmitting light from the luminescent layer;

the switching element further including:

a switching element electrode extending to the second contact hole and having a portion not covered with the insulating layer, the portion being in contact with the first electrode; and the light shield being disposed between the switching element electrode and the substrate, and being opposite to the electrode.

10. The emissive device according to claim 9, the switching element further including:

a plurality of electrodes; and the light shield being composed of the same material as any one of the plurality of the electrodes.

11. An electronic apparatus, comprising:

the emissive device according to claim 1.

12. The emissive device according to claim 1, the second contact hole and the light shield being elongated in the same direction in plan view.

13. The emissive device according to claim 1, the light shield extending in a first direction, the first electrode including:

a first portion that extends following the light shield in the first direction, and a second portion that extends away from the first portion in a second direction that intersects the first direction.

14. The emissive device according to claim 13, the second portion of the first electrode extending from the first portion toward the switching element.

15. The emissive device according to claim 1, the first electrode including:

a first portion that extends following the light shield in the axial direction of the second contact hole, and a second portion that extends away from the first portion in another direction that intersects the axial direction of the second contact hole.

16. The emissive device according to claim 15, the second portion of the first electrode extending from the first portion toward the switching element.

17. The emissive device according to claim 1, wherein a portion of the light shield entirely covering the second contact hole has a width substantially equal to or greater than that of the second contact hole.

* * * * *

UNITED STATES PATENT AND TRADEMARK OFFICE
CERTIFICATE OF CORRECTION

PATENT NO. : 7,719,011 B2  Page 1 of 1
APPLICATION NO. : 11/538696
DATED : May 18, 2010
INVENTOR(S) : Takehiko Kubota It is certified that error appears in the above-identified patent and that said Letters Patent is hereby corrected as shown below:

On the Cover Page, under (75) Inventor:

Please change "Taehiko Kubota" to "Ta<u>k</u>ehiko Kubota"

Signed and Sealed this

Third Day of August, 2010

David J. Kappos
*Director of the United States Patent and Trademark Office*